(12) United States Patent
We et al.

(10) Patent No.: US 11,658,391 B2
(45) Date of Patent: May 23, 2023

(54) ANTENNA MODULE

(71) Applicant: QUALCOMM Incorporated, San Diego, CA (US)

(72) Inventors: Hong Bok We, San Diego, CA (US); Aniket Patil, San Diego, CA (US); Jeahyeong Han, San Diego, CA (US); Mohammad Ali Tassoudji, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 72 days.

(21) Appl. No.: 17/129,084

(22) Filed: Dec. 21, 2020

(65) Prior Publication Data

US 2022/0200166 A1    Jun. 23, 2022

(51) Int. Cl.
*H01Q 1/52* (2006.01)
*H01Q 21/00* (2006.01)
*H01Q 23/00* (2006.01)
*H01Q 1/22* (2006.01)

(52) U.S. Cl.
CPC .......... *H01Q 1/2283* (2013.01); *H01Q 1/526* (2013.01); *H01Q 21/0087* (2013.01); *H01L 2223/6677* (2013.01); *H01Q 23/00* (2013.01)

(58) Field of Classification Search
CPC .......... H01Q 1/22; H01Q 1/2283; H01Q 1/52; H01Q 1/526; H01Q 21/0087; H01L 2223/6677
See application file for complete search history.

(56) References Cited

U.S. PATENT DOCUMENTS

| | | | |
|---|---|---|---|
| 5,023,624 | A | 6/1991 | Heckaman et al. |
| 5,444,453 | A | 8/1995 | Lalezari |
| 7,728,774 | B2 | 6/2010 | Akkermans et al. |
| 9,265,151 | B2 | 2/2016 | Jünemann et al. |
| 9,620,464 | B2 | 4/2017 | Baks et al. |
| 10,340,249 | B1 | 7/2019 | Yu et al. |
| 10,374,322 | B2 | 8/2019 | Labonte et al. |
| 10,541,464 | B2 | 1/2020 | Khan et al. |

(Continued)

OTHER PUBLICATIONS

International Search Report and Written Opinion—PCT/US2021/072517—ISA/EPO—dated Mar. 7, 2022.

*Primary Examiner* — Jason Crawford
(74) *Attorney, Agent, or Firm* — Muncy, Geissler, Olds & Lowe, P.C.

(57) ABSTRACT

Aspects disclosed herein include a device including a first antenna substrate including one or more antennas. The device also includes a metallization structure. The device also includes a first spacer disposed between the first antenna substrate and the metallization structure, configured to maintain a constant distance between the first antenna substrate and the metallization structure. The device also includes a first plurality of conductive elements, disposed within the first spacer, configured to electrically couple the first antenna substrate to the metallization structure. The device also includes where the first spacer is configured to enclose all the conductive elements, electrically coupled to the first antenna substrate, and is configured to form an air gap between the first antenna substrate and the metallization structure. The device also includes where the first plurality of conductive elements is separated by air in the air gap.

49 Claims, 10 Drawing Sheets

(56) References Cited

U.S. PATENT DOCUMENTS

| | | | |
|---|---|---|---|
| 10,685,924 B2 * | 6/2020 | Lasiter | H01L 24/20 |
| 10,734,332 B2 | 8/2020 | Lasiter et al. | |
| 11,011,827 B2 * | 5/2021 | Thai | H01L 23/66 |
| 2006/0033664 A1 | 2/2006 | Soler et al. | |
| 2011/0102289 A1 | 5/2011 | Leem | |
| 2016/0049723 A1 * | 2/2016 | Baks | H01Q 9/0457 |
| | | | 343/848 |
| 2017/0194270 A1 | 7/2017 | Webb | |
| 2018/0034134 A1 * | 2/2018 | Dalmia | H01Q 1/243 |
| 2018/0138155 A1 * | 5/2018 | Kim | H01L 25/50 |
| 2018/0145035 A1 | 5/2018 | Singh et al. | |
| 2018/0159203 A1 * | 6/2018 | Baks | H01Q 1/48 |
| 2018/0159209 A1 * | 6/2018 | Mikata | B32B 27/06 |
| 2018/0191062 A1 | 7/2018 | Ndip et al. | |
| 2018/0240762 A1 | 8/2018 | Kamgaing et al. | |
| 2018/0286816 A1 * | 10/2018 | Kitazaki | H01L 23/3121 |
| 2019/0035749 A1 * | 1/2019 | Dalmia | H01Q 1/2283 |
| 2019/0058241 A1 | 2/2019 | So et al. | |
| 2019/0067221 A1 * | 2/2019 | Lasiter | H01Q 1/2283 |
| 2019/0115646 A1 * | 4/2019 | Chiu | H01Q 19/062 |
| 2019/0140361 A1 * | 5/2019 | Labonte | H01L 23/49816 |
| 2019/0191597 A1 * | 6/2019 | Han | H01Q 21/065 |
| 2019/0229433 A1 * | 7/2019 | Labonte | H01Q 9/0457 |
| 2019/0372198 A1 | 12/2019 | Dalmia et al. | |
| 2020/0006846 A1 * | 1/2020 | Lasiter | H01Q 21/08 |
| 2020/0035625 A1 | 1/2020 | Wang et al. | |
| 2020/0091581 A1 * | 3/2020 | Ou | H01Q 21/065 |
| 2021/0083389 A1 * | 3/2021 | Tung | H01Q 9/0414 |
| 2021/0280959 A1 * | 9/2021 | Han | H01L 23/552 |
| 2021/0366838 A1 * | 11/2021 | Han | H01L 23/66 |
| 2021/0368615 A1 * | 11/2021 | Snir | H05K 1/0243 |
| 2022/0200166 A1 * | 6/2022 | We | H01Q 1/2283 |

* cited by examiner

ANTENNA MODULE

FIELD OF DISCLOSURE

The field of the disclosed subject matter relates to device packaging. In particular, the field of the disclosed subject matter relates to antenna modules and further to antenna modules for millimeter wave (mm-Wave) applications.

BACKGROUND

Fifth generation (5G) cellular networks, commonly referred to as 5G NR, are expected to include frequencies in the range of 24.25 to 86 GHz to be used for mobile devices. For ease of reference, the signals transmitted in this range will be referred to as millimeter wave (mm-Wave). It should be recognized that 5G mm-Wave may cover frequencies from 30 GHz to 300 GHz. Frequency segments within the mm-Wave frequencies may be processed by an individual radio frequency integrated circuit (RFIC) and one or more associated antenna modules. Packaging strategies used for the mm-Wave applications have several issues (not exhaustive):
- The size of the package is dictated by the antenna size which is related to the frequency. The antenna size can be much larger than the RFIC.
- A low temperature co-fired ceramic (LTCC) package has good electrical performance, but is also more expensive relative to other packaging options.
- For an antenna-on-chip (AOC) package, the antenna is limited to the size of the chip which can limit performance, or increase cost if the chip size is increased to accommodate the antenna.
- For a fan-out wafer level package (FOWLP), the antenna module is aperture or proximity fed which can limit performance, e.g., relative to probe fed packages.
- For a package-on-package (POP), the antenna and the chip packages are connected using solder balls. The solder balls used for connecting the packages are isotopic in dimension so they limit the separation between packages. Additionally, the large solder balls also have large insertion losses (~1 dB).
- Using flip chip ball grid array (FCBGA) construction uses multiple additional build-up layers to achieve a symmetric structure and the required separation between the antenna and ground layers (~400 μm). For larger separation between the antenna and the ground layer (~1 mm or more), this type of package requires a prohibitive number of build-up layers which adds to cost and manufacturing complexity.

Conventional antenna modules structures have thick substrate, low design flexibility, poor design rules and large form factor, which are among the various disadvantages for use in mobile devices. Conventional designs are also inflexible as a new mold chase is required every new design. Additionally, conventional designs use high cost low dielectric constant (Dk) materials. Further, conventional designs using modified semi additive process (mSAP) substrate technology increase the fabrication costs, space, and footprint.

Accordingly, there is a need for systems, apparatus, and methods that overcome the deficiencies of conventional approaches including the methods, system and apparatus provided herein.

SUMMARY

This summary identifies features of some example aspects and is not an exclusive or exhaustive description of the disclosed subject matter. Whether features or aspects are included in or omitted from this Summary is not intended as indicative of relative importance of such features. Additional features and aspects are described and will become apparent to persons skilled in the art upon reading the following detailed description and viewing the drawings that form a part thereof.

In accordance with the various aspects disclosed herein, at least one aspect includes, a device, including a first antenna substrate including one or more antennas. The device also includes a metallization structure. The device also includes a first spacer disposed between the first antenna substrate and the metallization structure, configured to maintain a constant distance between the first antenna substrate and the metallization structure. The device also includes a first plurality of conductive elements, disposed within the first spacer, configured to electrically couple the first antenna substrate to the metallization structure. The device also includes where the first spacer is configured to enclose all the conductive elements, electrically coupled to the first antenna substrate, and is configured to form an air gap between the first antenna substrate and the metallization structure. The device also includes where the first plurality of conductive elements is separated by air in the air gap.

In accordance with the various aspects disclosed herein, at least one aspect includes, a method of fabricating a device, including forming a metallization structure. The method of fabricating also includes forming a first spacer on the metallization structure, where the first spacer is configured to maintain a constant distance between a first antenna substrate and the metallization structure. The method of fabricating also includes forming a first plurality of conductive elements, disposed within the first spacer, configured to electrically couple the first antenna substrate to the metallization structure. The method of fabricating also includes attaching the first antenna substrate including one or more antennas to the first spacer and first plurality of conductive elements. The method of fabricating also includes where the first spacer encloses all the conductive elements, electrically couples to the first antenna substrate and forms an air gap between the first antenna substrate and the metallization structure. The method of fabricating also includes where the first plurality of conductive elements is separated by air in the air gap.

Other features and advantages associated with the apparatuses and methods disclosed herein will be apparent to those skilled in the art based on the accompanying drawings and detailed description.

BRIEF DESCRIPTION OF THE DRAWINGS

The accompanying drawings are presented to aid in the description of examples of one or more aspects of the disclosed subject matter and are provided solely for illustration of the examples and not limitation thereof.

Figure 1A:
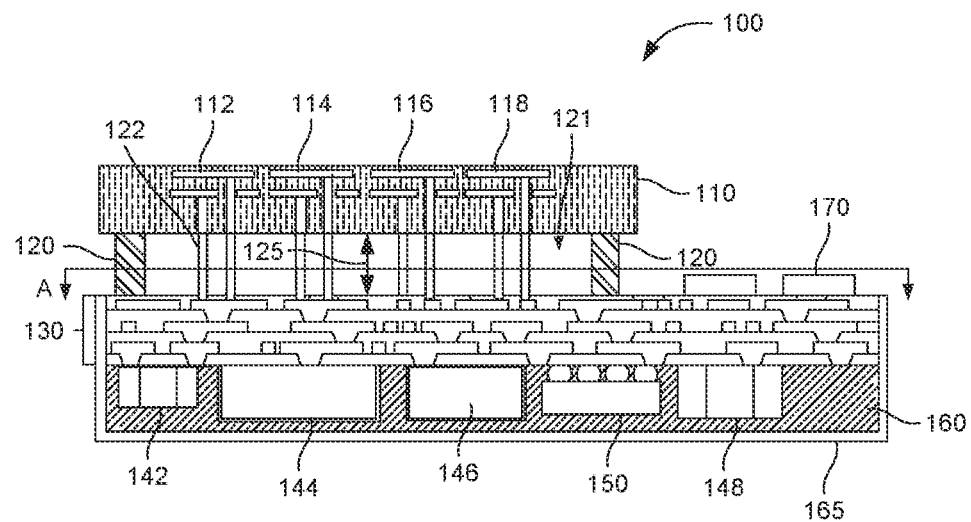
FIG. 1A illustrates a partial side view of an antenna module in accordance with at least one aspect of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the subject matter are provided in the following description and related drawings directed to specific examples of the disclosed subject matter. Alternative aspects may be devised without departing from the scope of the disclosed subject matter.

The word "exemplary" is used herein to mean "serving as an example, instance, or illustration." Any aspect described herein as "exemplary" is not necessarily to be construed as preferred or advantageous over other embodiments. Likewise, the term "aspects" does not mean that all aspects of the disclosed subject matter include the discussed feature, advantage, or mode of operation.

The terminology used herein is for the purpose of describing particular examples and is not intended to be limiting. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, processes, operations, elements, and/or components, but do not preclude the presence or addition of one or more other features, integers, processes, operations, elements, components, and/or groups thereof.

The various aspects disclosed herein allow for various improvements over conventional designs, such as faster manufacturing and assembly time and a reduction in complexity due to partial molding. Further, the overall material and manufacturing cost are reduced. The various aspects disclosed herein also provide better shielding for the active components and metallization layers (e.g., redistribution (RDL) layers, and the like). Overall thickness of the module is also reduced which is a positive feature in smart phones and other mobile devices. The various aspects disclosed include an air cavity in the antenna layers which improves loss, efficiency, frequency bandwidth and improves manufacturing tolerance. Further, extra substrate layers are eliminated in the antenna portion which was used in conventional designs to satisfy symmetric stack-up.

FIG. 1A illustrates a partial side view of an antenna module 100 in accordance with some examples of the disclosure. As shown in FIG. 1A, antenna module 100 may include an antenna substrate 110, a metallization structure 130 (e.g., an RDL), which may include a plurality of metal layers separated by insulating layers with portions of the metal layers coupled to adjacent metal layers by vias. The antenna substrate 110 may be formed from any organic dielectric material, such as bismaleimide-triazine (BT) or epoxy-glass (FR-4). However, it will be appreciated that the antenna substrate 110 is not limited to these examples. A spacer 120 is disposed between the antenna substrate 110 and the metallization structure 130. The spacer 120 is configured to maintain a constant distance 125 between the antenna substrate 110 and the metallization structure 130. The spacer 120 in some aspects may be formed of a non-conductive material. However, in alternate aspects, the spacer 120 may be formed of a conductive material, such as, Al, Cu, Ag, Au coated surfaces and which may be coated by sputtering, plating, spraying or any other coating technique. The spacer 120, in some aspects, may electrically couple the antenna substrate 110 to ground. A plurality of conductive elements 122 is disposed within the spacer 120. The conductive elements 122 (e.g., pillars, bars, and the like) are configured to electrically couple the antenna substrate 110 to the metallization structure 130 and in some aspects may be directly coupled to antennas 112, 114, 116, and 118, as illustrated. The conductive elements 122 may be formed from any high conductive material, such as, copper (Cu), aluminum (Al), silver (Ag), gold (Au) or other conductive materials, alloys, or combinations thereof. The plurality of conductive elements 122 are separated by air in an air gap 121 formed from trapped air within the spacer 120. The spacer may be formed by printing, lamination and/or lithographic processing. It will be appreciated that these techniques allow for establishing a precise height of the spacer 120, which in turn allows for precise control of the constant distance 125. It will be appreciated that the shape and height of the spacer 120 can be control by the printing process or dispensing process. It will be appreciated that the trapped air in air gap 121 has a Dk of 1.0, which when combined with the constant distance 125 allows for precise tuning of antenna module 100.

The antenna module 100 of FIG. 1A, further may include at least one electrical component coupled to the metallization structure 130. For example, the at least one electrical component, as illustrated, may include one or more passive components 142 and 148, a radio frequency integrated circuit (RFIC) die 144; a power amplifier (PA) die 146; and a power supply component 150 (e.g., a power management integrated circuit (PMIC) and the like); each electrically coupled to the metallization structure 130 on a side opposite the antenna substrate 110. Each of these electrical components (e.g., passive components 142 and 148, RFIC die 144, PA die 146, power supply component 150) is shown to be encapsulated in a mold compound 160. In other aspects, the mold compound may be omitted. Further, an electromagnetic interference (EMI) shield 165 is provided that at least partially encloses the mold compound 160 and components encapsulated in the mold compound 160 (e.g., passive components 142 and 148, RFIC die 144, PA die 146, power supply component 150) and metallization structure 130. In other aspects, the EMI shield may be omitted. In some aspects, the EMI shield 165 may be coupled to the spacer 120 (e.g., when formed of a conductive material) and both may be coupled to ground. Connection pads 170 can also be provided that are electrically coupled to the metallization structure 130 on the same side as the antenna substrate 110.

Figure 1B:
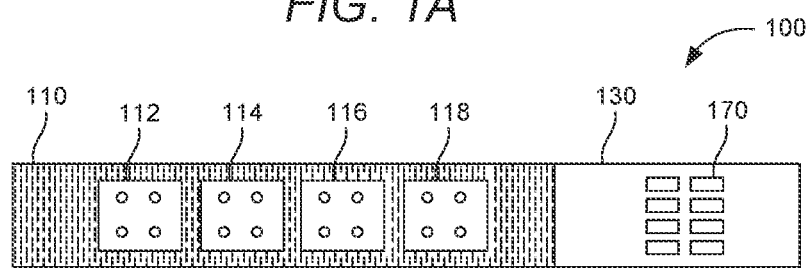
FIG. 1B illustrates a top view of the antenna module in FIG. 1A in accordance with at least one aspect of the disclosure.

FIG. 1B illustrates a top view of the antenna module 100 in accordance with some examples of the disclosure. As discussed above, the antenna module 100 includes the antenna substrate 110 and the metallization structure 130 (note: the top passivation/insulating layer is illustrated). The antennas 112, 114, 116 and 118 may be formed as patch antennas, or any suitable antenna type. Additionally, the antennas 112, 114, 116 and 118 may be formed as part of an antenna array, such as a 4 by x array, where x may be any integer greater than zero. The antennas 112, 114, 116 and 118 may be formed from any high conductive material, such as, copper (Cu), aluminum (Al), silver (Ag), gold (Au) or other conductive materials, alloys, or combinations thereof. Further, as illustrated in the top view, the connection pads 170 may be formed as a plurality of pads or any suitable configuration for coupling to external devices, components, circuits, and the like. It will be appreciated that the foregoing illustration was provided solely to aid in explanation of the various aspects disclosed and should not be construed as limiting the various aspects disclosed. For example, although not expressly illustrated the antennas may be more or less than 4 and may be configured in a staggered or other non-linear configuration. Likewise, the connection pads may have more pads, fewer pads, or the pads may be arranged in a different configuration (e.g., more or less than two rows, non-linear, etc.) than illustrated.

Figure 1C:
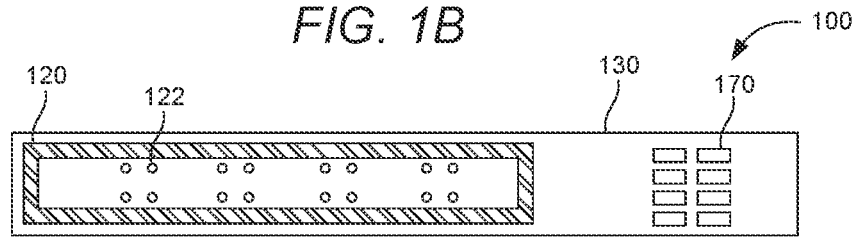
FIG. 1C illustrates a cross-sectional view at line A-A in FIG. 1A of an antenna module in accordance with at least one aspect of the disclosure.
Figure 1D:
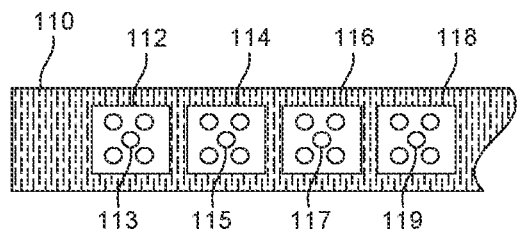
FIG. 1D illustrates a portion of an antenna module having an additional post in accordance with at least one aspect of the disclosure.

FIG. 1C illustrates a cross-sectional view at line A-A in FIG. 1A of an antenna module 100 in accordance with some examples of the disclosure. As discussed above, the antenna module 100 includes the antenna substrate 110, the metallization structure 130 (note: the top passivation/insulating layer is illustrated) and connection pads 170. The spacer 120 encloses all of the conductive elements 122 that are coupled to the antenna substrate 110 (not visible). The spacer 120 completely encloses the conductive elements 122 forming an air gap and the conductive elements 122 are separated from each other by air that is trapped in the air gap. In some aspects, the spacer 120 may be a continuous side wall of constant height forming a closed loop and defining an open space within. Additionally, it will be appreciated that there will be at least one conductive element per antenna and there may be a plurality of conductive elements per antenna (e.g., 4 as illustrated) based on the number of bands and polarizations covered. In some aspects one conductive element can be used for one polarization and one band configurations. For dual-polarization, dual-band configurations, 4 elements can be used. In further aspects, a conductive post can be provided in the middle of the patch to improve performance as illustrated in FIG. 1D. In accordance with some aspects of the disclosure, the antennas 112, 114, 116 and 118 may be formed as patch antennas that include conductive posts 113, 115, 117 and 119, respectively. The conductive posts 113, 115, 117 and 119 may be formed from any high conductive material, such as, copper (Cu), aluminum (Al), silver (Ag), gold (Au) or other conductive materials, alloys, or combinations thereof. It will be appreciated that the foregoing illustrations are provided solely to aid in explanation of the various aspects disclosed and should not be construed as limiting the various aspects disclosed. For example, although not expressly illustrated, there may be more or less than 4 conductive elements per antenna, as discussed above. Further, the spacer 120 is not limited to the generally rectangular shape illustrated and instead the spacer 120 may take any shape that can enclose the conductive elements 122.

Figure 2A:
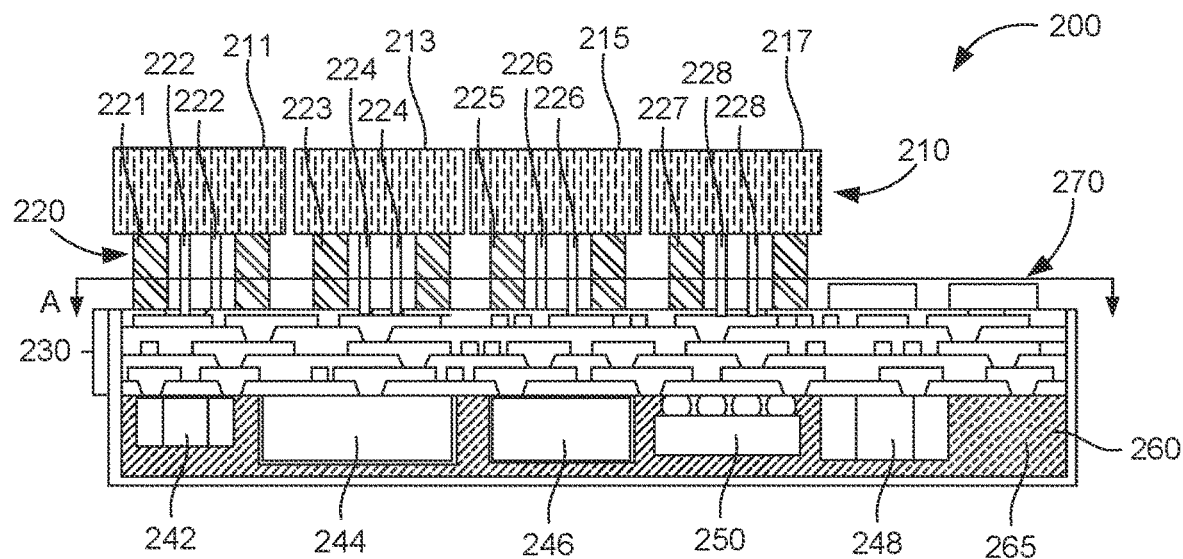
FIG. 2A illustrates a partial side view of an antenna module in accordance with at least one aspect of the disclosure.

FIG. 2A illustrates a partial side view of an antenna module 200 in accordance with some examples of the disclosure. As shown in FIG. 2A, antenna module 200 may include a plurality of antenna substrates 210, a metallization structure 230 which may include a plurality of metal layers separated by insulating layers with portions of the metal layers coupled to adjacent metal layers by vias. A plurality of spacers 220 are disposed between the plurality of antenna substrates 210 and the metallization structure 230. The plurality of spacers 220 each are configured to maintain a constant distance between each of the plurality of antenna substrates 210 and the metallization structure 230. In some aspects, the plurality of spacers 220 may each be configured to maintain a same constant distance and in other aspects, at least one spacer of the plurality of spacers 220 may be configured to maintain a different constant distance than at least one other spacer of the plurality of spacers. In some aspects, the plurality of spacers 220 may be formed of a non-conductive material. However, in alternate aspects, the plurality of spacers 220 may be formed of a conductive material and may be used to electrically couple the plurality of antenna substrates 210 to ground. Further, in some aspects, the plurality of spacers 220 may include at least one spacer formed from a conductive material and at least one spacer formed from a non-conductive material. The conductive elements 222, 224, 226 and 228 (e.g., pillars, bars, etc.) are configured to electrically couple each of the plurality of antenna substrates 210 to the metallization structure 130 and in some aspects may be directly coupled to antennas in each of the antenna substrates. For example, the plurality of spacers 220 may include a first spacer 221, a second spacer 223, a third spacer 225 and a fourth spacer 227. The plurality of conductive elements may include a first set of conductive elements 222, a second set of conductive elements, 224, a third set of conductive elements 226 and a fourth set of conductive elements 228, where individual conductive elements of each set of conductive elements 222, 224, 226, and 228 are separated by air in an air gap formed from trapped air within an associated spacer (e.g., 221, 223, 225 and 227) of the plurality of spacers 220. Each set of conductive elements 222, 224, 226, and 228 may include one or more conductive elements. The plurality of spacers 220 may be formed by printing, lamination and/or lithographic processing. It will be appreciated that these techniques allow for establishing a precise height of the plurality of spacers 220, which in turn allows for precise control of the constant distance between the plurality of antenna substrates 210 and the metallization structure 230. For example, the first spacer 221 establishes a first constant distance between a first antenna substrate 211 and the metallization structure 230. The second spacer 223 establishes a second constant distance between a second antenna substrate 213 and the metallization structure 230. The third spacer 225 establishes a third constant distance between a third antenna substrate 215 and the metallization structure 230. The fourth spacer 227 establishes a fourth constant distance between a fourth antenna substrate 217 and the metallization structure 230. In some aspects the first, second, third and fourth constant distances may all be the same. In other aspects, at least one of the first, second, third and fourth constant distances may be different from at least one other of the constant distances.

The antenna module 200 of FIG. 2A, further may include at least one electrical component coupled to the metallization structure 230. For example, the at least one electrical component, as illustrated, may include one or more passive components 242 and 248, a radio frequency integrated circuit (RFIC) die 244; a power amplifier (PA) die 246; and a power supply component 250 (e.g., a power management integrated circuit (PMIC) and the like); each electrically coupled to the metallization structure 230 on a side opposite the plurality of antenna substrates 210. Each of these electrical components (e.g., passive components 242 and 248, RFIC die 244, PA die 246, power supply component 250) is encapsulated in a mold compound 260. Further, an electromagnetic interference (EMI) shield 265 is provided that at least partially encloses the mold compound 260 and components encapsulated in the mold compound 260 (e.g., passive components 242 and 248, RFIC die 244, PA die 246, power supply component 250) and metallization structure 230. In other aspects, the mold compound 260 and/or the EMI shield 265 may be omitted. In some aspects, the EMI shield 265 may be coupled to at least one of the plurality of spacers 220 (e.g., when formed of a conductive material) and both may be coupled to ground. Connection pads 270 can also be provided that are electrically coupled to the metallization structure 130 on the same side as the plurality of antenna substrates 210.

Figure 2B:
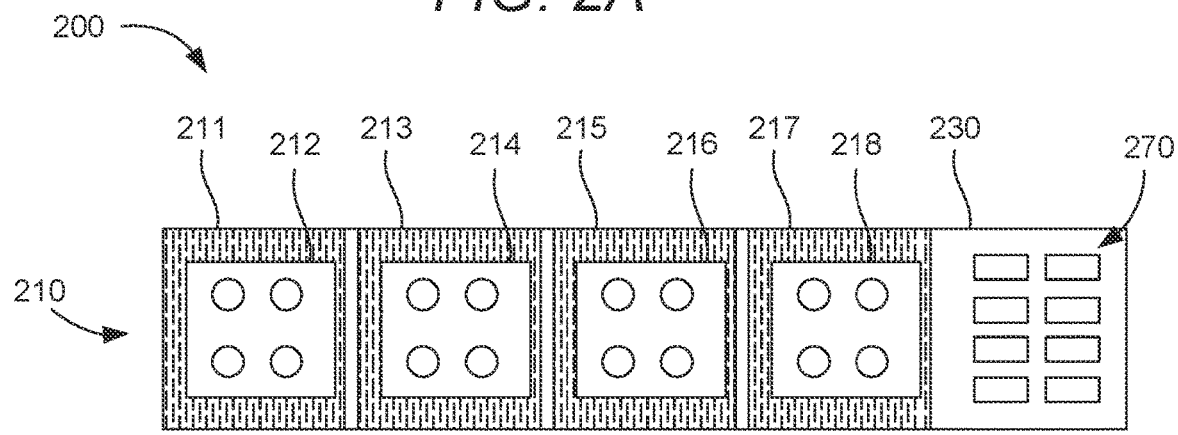
FIG. 2B illustrates a top view of the antenna module in FIG. 2A in accordance with at least one aspect of the disclosure.

FIG. 2B illustrates a top view of an antenna module 200 in accordance with some examples of the disclosure. As discussed above, the antenna module 200 includes the plurality of antenna substrates 210, and the metallization structure 230 (note: the top passivation/insulating layer is illustrated). Each of the plurality of antenna substrates 210 may include one or more antennas. For example, the antenna substrates 211, 213, 215 and 217 may each include antennas 212, 214, 216 and 218, respectively. Antennas 212, 214, 216 and 218, may be formed as patch antennas, or any suitable antenna type. Additionally, the antennas 212, 214, 216 and 218 may be formed as part of an antenna array, such as a 4 by x array, where x may be any integer greater than or equal to one. The antennas 212, 214, 216 and 218 may be formed from any high conductive material, such as, copper (Cu), aluminum (Al), silver (Ag), gold (Au) or other conductive materials, alloys, or combinations thereof. Further, as illustrated in the top view, the connection pads 270 may be formed as a plurality of pads or any suitable configuration for coupling to external devices, components, circuits, etc. It will be appreciated that the foregoing illustration was provided solely to aid in explanation of the various aspects disclosed and should not be construed as limiting the various aspects disclosed. For example, although not expressly illustrated there may be more or less than four antenna substrates and each may have more than one antenna. The antenna substrates and/or the antennas may be configured in a staggered or other non-linear configuration. Likewise, the connection pads may have more pads, fewer pads, or the pads may be arranged in a different configuration (e.g., more or less than two rows, non-linear, etc.) than illustrated.

Figure 2C:
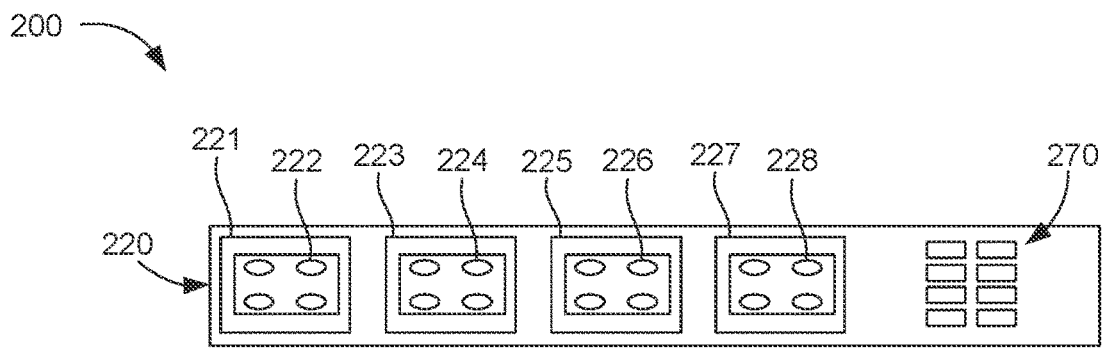
FIG. 2C illustrates a cross-sectional view at line A-A in FIG. 2A of the antenna module in accordance with at least one aspect of the disclosure.

FIG. 2C illustrates a cross-sectional view at line A-A in FIG. 2A of an antenna module 200 in accordance with some examples of the disclosure. As discussed above, the antenna module 200 includes the metallization structure 230 (note: the top passivation/insulating layer is illustrated) and connection pads 270. The plurality of spacers 220 encloses each of the associated set conductive elements that are coupled to the associated plurality of antenna substrates (not illustrated). For example, the first spacer 221 encloses the first set of conductive elements 222. The second spacer 223 encloses the second set of conductive elements 224. The third spacer 225 encloses the third set of conductive elements 226. The fourth spacer 227 encloses the fourth set of conductive elements 224. The individual conductive elements of each set of conductive elements 222, 224, 226 and 228 are separated by air in an air gap formed from trapped air within the associated spacer 221, 223, 225 and 227, respectively, of the plurality of spacers 220. Additionally, it will be appreciated that there will be at least one conductive element per antenna and there may be a plurality of conductive elements per antenna (e.g., 4 as illustrated) based on the number of bands and polarizations covered. It will be appreciated that the foregoing illustration was provided solely to aid in explanation of the various aspects disclosed and should not be construed as limiting the various aspects disclosed. For example, although not expressly illustrated, there may be more or less than 4 conductive elements per antenna. Further, the plurality of spacers may each have the same or different shapes and the plurality of spacers are not limited to the generally rectangular shape illustrated.

Figure 3A:
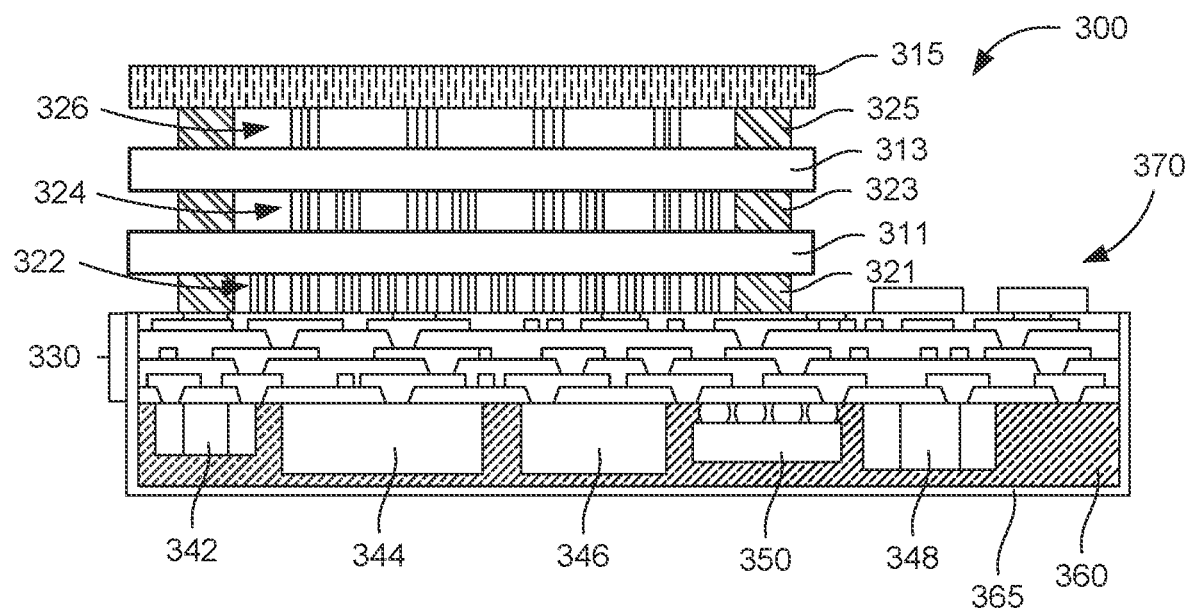
FIG. 3A illustrates a partial side view of an antenna module in accordance with at least one aspect of the disclosure.

FIG. 3A illustrates a partial side view of an antenna module 300 in accordance with at least one aspect of the disclosure. As shown in FIG. 3A, antenna module 300 may include a plurality of antenna substrates 311, 313 and 315, a metallization structure 330 which may include a plurality of metal layers separated by insulating layers with portions of the metal layers coupled to adjacent metal layers by vias. A first spacer 321 is disposed between the first antenna substrate 311 and the metallization structure 330. The first spacer 321 is configured to maintain a first constant distance between the first antenna substrate 311 and the metallization structure 330. The first spacer 321 in some aspects may be formed of a non-conductive material. However, in alternate aspects, the first spacer 321 may be formed of a conductive material and may be used to electrically couple the first antenna substrate 311 to ground. A first plurality of conductive elements 322 is disposed within the first spacer 321. The first plurality of conductive elements 322 (e.g., pillars, bars, etc.) are configured to electrically couple the first antenna substrate 311 to the metallization structure 330. The first plurality of conductive elements 322 may also include one or more pass-through conductive elements configured to electrically couple signals passing through the first antenna substrate 311 (e.g., from higher row substrates) to the metallization structure 330.

A second antenna substrate 313 may include one or more antennas. A second spacer 323 is disposed between the second antenna substrate 313 and the first antenna substrate 311. The second spacer 323 is configured to maintain a second constant distance between the second antenna substrate 313 and the first antenna substrate 311. The second spacer 323 is configured to enclose all of a second plurality of conductive elements 324 electrically coupled to the second antenna substrate 313. The second plurality of conductive elements 324 is disposed within the second spacer 323. The second plurality of conductive elements 324 electrically couples the second antenna substrate 313 to the first antenna substrate 311. Further, it will be appreciated that at least some of the second plurality of conductive elements 324 electrically couples the second antenna substrate 313 to the metallization structure 330 through the first antenna module 311 and the one or more pass-through conductive elements of the first plurality of conductive elements 322. Further, the second plurality of conductive elements 324 may also include one or more pass-through conductive elements.

A third antenna substrate 315 may include one or more antennas. A third spacer 325 is disposed between the third antenna substrate 315 and the second antenna substrate 313. The third spacer 325 is configured to maintain a third constant distance between the third antenna substrate 315 and the second antenna substrate 313. The third spacer 323 is configured to enclose all of a third plurality of conductive elements 326 electrically coupled to the third antenna substrate 315. The third plurality of conductive elements 326 electrically couples the third antenna substrate 315 to the second antenna substrate 313. Further, it will be appreciated that at least some of the third plurality of conductive elements 326 electrically couples the third antenna substrate 315 to the metallization structure 330 through the second antenna module 311 and the one or more pass-through conductive elements of the second plurality of conductive elements 324, which then passes through the first antenna module 311 and the one or more pass-through conductive elements of the first plurality of conductive elements 322 electrically couple to the metallization structure 330.

In some aspects, the first spacer 321, the second spacer 323 and the third spacer 325 may each be configured to maintain the same constant distance. In other aspects, at least one of the first spacer 321, the second spacer 323 and the third spacer 325 may be configured to maintain a different constant distance than at least one other spacer. In some aspects, the first spacer 321, the second spacer 323 and/or the third spacer 325 may be formed of a non-conductive material. However, in alternate aspects, the first spacer 321, the second spacer 323 and/or the third spacer 325 may be formed of a conductive material and may be used to electrically couple one or more of antenna substrates 311, 313 and 315 to ground. Further, in some aspect, the spacers 321, 323 and 325 may include at least one spacer formed from a conductive material and at least one spacer formed from a non-conductive material. The spacers 321, 323 and 325 may be formed by printing, lamination and/or lithographic processing. The conductive elements 322, 324 and 326 (e.g., pillars, bars, etc.) are configured to electrically couple each of the antenna substrates 311, 313 and 315, respectively to the metallization structure 330. Each of the plurality of conductive elements 322, 324 and 326 may include at least one set of conductive elements for each antenna (not illustrated) in an antenna substrate (e.g., first antenna substrate 311). Further, some of the plurality of conductive elements (e.g., 322 and 324) may include at least one set of pass-through conductive elements for each antenna (not illustrated) in any subsequent antenna substrates whose signals pass through that substrate. For example, the first plurality of conductive elements will have at least one set of pass-through conductive elements for each antenna in the second antenna substrate 313 and for each antenna in the third antenna substrate 315, since both of these substrates have connections that pass through the first antenna substrate 311 to the metallization structure 330. Accordingly, if each antenna substrate 311, 313 and 315 has 4 antennas, at least 8 sets of pass-through conductive elements will be included in the first plurality of conductive elements 322 along with at least 4 sets of conductive elements coupled to the 4 antennas in the first antenna substrate. Further, at least 4 sets of pass-through conductive elements will be included in the second plurality of conductive elements 324 along with at least 4 sets of conductive elements coupled to the 4 antennas in the second antenna substrate 313. Finally, the third plurality of conductive elements 326 will include at least 4 sets of conductive elements coupled to the 4 antennas in the third antenna substrate 315. It will be appreciated that each set of conductive elements may have one or more conductive elements. Each conductive element in each of the plurality of conductive elements 322, 324, and 326 are separated by air in an air gap formed from trapped air within spacers 321, 323 and 327, respectively. It will be appreciated that the spacers 321, 323 and 327 allow for establishing a precise height, which in turn allows for precise control of the constant distance between the antenna substrates 311, 313 and 315 and the metallization structure 330.

The antenna module 300 of FIG. 3A, may further include at least one electrical component coupled to the metallization structure 330. For example, the at least one electrical component, as illustrated, may include one or more passive components 342 and 348, a radio frequency integrated circuit (RFIC) die 344; a power amplifier (PA) die 346; and a power supply component 350 (e.g., a power management integrated circuit (PMIC) and the like); each electrically coupled to the metallization structure 330 on a side opposite the plurality of antenna substrates 310. Each of these electrical components (e.g., passive components 342 and 348, RFIC die 344, PA die 346, power supply component 350) is encapsulated in a mold compound 360. Further, an electromagnetic interference (EMI) shield 365 is provided that at least partially encloses the mold compound 360 and components encapsulated in the mold compound 360 (e.g., passive components 342 and 348, RFIC die 344, PA die 346, power supply component 350) and metallization structure 330. In other aspects, the mold compound 360 and/or the EMI shield 365 may be omitted. In some aspects, the EMI shield 365 may be electrically coupled to at least one of the spacers 321, 323 and/or 325 (e.g., when formed of a conductive material) and may also be coupled to ground. Connection pads 370 can also be provided that are electrically coupled to the metallization structure 330 on the same side as the antenna substrates 311, 313 and 315. It will be appreciated that the multiple stacks of antenna substrates allows for more air cavity creation and for configuring the antennas to various frequency ranges.

Figure 3B:
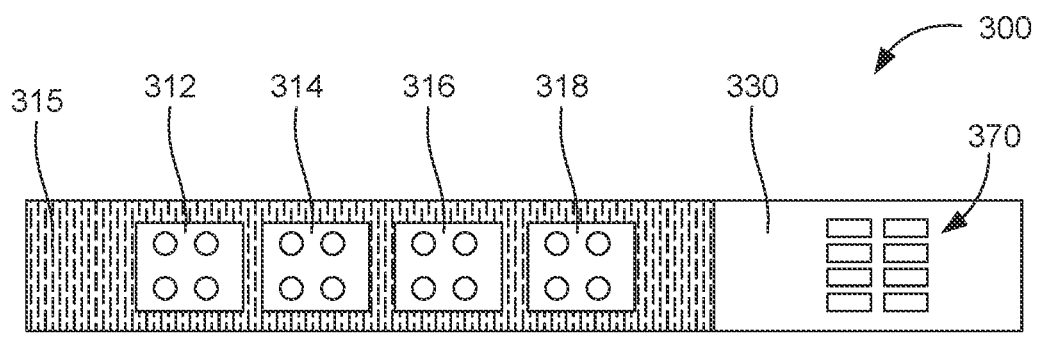
FIG. 3B illustrates a top view of the antenna module in FIG. 3A in accordance with at least one aspect of the disclosure.

FIG. 3B illustrates a top view of an antenna module 300 in accordance with at least one aspect of the disclosure. As discussed above, the antenna module 300 includes multiple antenna substrates including the third antenna substrate 315, which is the top most antenna substrate and visible in the top view. The antenna module 300 includes the metallization structure 330 (note: the top passivation/insulating layer is illustrated). The third antenna substrate 315 may include one or more antennas. For example, third antenna substrate 315 may include antennas 312, 314, 316 and 318. Antennas 312, 314, 316 and 318, may be formed as patch antennas, or any suitable antenna type. Additionally, the antennas 312, 314, 316 and 318 may be formed as part of an antenna array, such as a 4 by x array, where x may be any integer greater than or equal to one. The antennas 312, 314, 316 and 318 may be formed from any high conductive material, such as, copper (Cu), aluminum (Al), silver (Ag), gold (Au) or other conductive materials, alloys, or combinations thereof. Further, as illustrated in the top view, the connection pads 370 may be formed as a plurality of pads or any suitable configuration for coupling to external devices, components, circuits, etc. It will be appreciated that the foregoing illustration was provided solely to aid in explanation of the various aspects disclosed and should not be construed as limiting the various aspects disclosed. For example, although not expressly illustrated there may be more or less than four antennas in each antenna substrate. The antenna substrates and/or the antennas may be configured in a staggered or other non-linear configuration. Likewise, the connection pads may have more pads, fewer pads, or the pads may be arranged in a different configuration (e.g., more or less than two rows, non-linear, etc.) than illustrated.

Figure 4A:
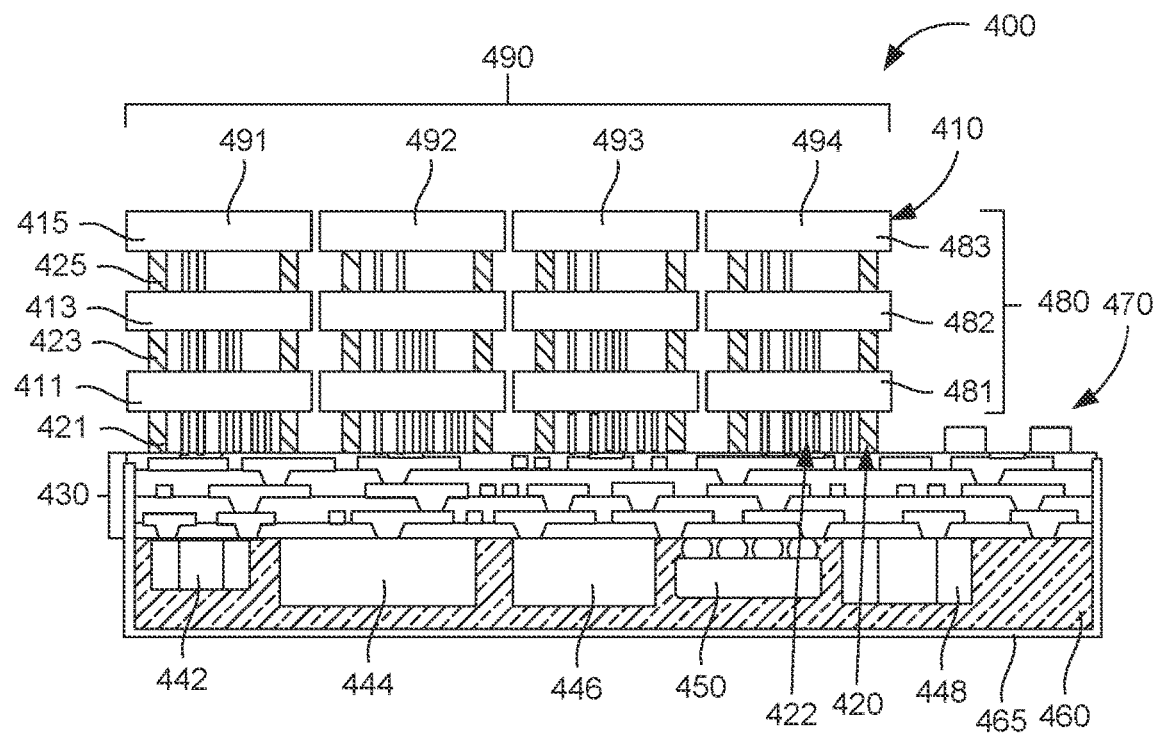
FIG. 4A illustrates a partial side view of an antenna module in accordance with at least one aspect of the disclosure.

FIG. 4A illustrates a partial side view of an antenna module 400 in accordance with at least one aspect of the disclosure. As shown in FIG. 4A, antenna module 400 may include a metallization structure 430 which may include a plurality of metal layers separated by insulating layers with portions of the metal layers coupled to adjacent metal layers by vias. The antenna module 400 also includes a plurality of antenna substrates 410, which may be arranged in one or more rows 480 and one or more columns 490. In the illustrated configuration, three rows 480 and four columns are provided to form a three row by four column grouping of antenna substrates 410. In the following description, since much of the individual elements have been discussed in the foregoing (e.g., antenna substrates, spacers, conductive elements, etc.) details of each of these elements will not be provided herein. For example, the first antenna substrate 411, the second antenna substrate 413 and the third antenna substrate 415 are arranged in a single column (similar to as described in relation to FIG. 3A). The first antenna substrate 411 is in a first row 481, the second antenna substrate 413 is in a second row 481 and the third antenna substrate 415 is in a third row 483. The first row 481 is located between the second row 482 and the metallization structure 430 and the second row 482 is located between the third row 483 and the first row 481. A plurality of additional antenna substrates 410 is provided with each including one or more antennas (not illustrated). Further, each additional antenna substrate has an associated spacer 422 and one or more associated conductive elements 422. Each associated spacer 422 is disposed below the associated antenna substrate 410 and each of the one or more associated conductive elements 422 are disposed within each associated spacer 422. The one or more associated conductive elements 422 are configured to electrically couple each of the additional antenna substrates 410 to another antenna substrate 410 or the metallization structure 430. The plurality of additional antenna substrates 410 and associated spacers 420 and one or more associated conductive elements 422 are arranged in one or more additional columns or rows. As illustrated, the plurality of additional antenna substrates 410 and associated spacers 420 and one or more associated conductive elements 422 are arranged in three additional columns 492, 493, and 494 (in addition to the column 491 containing the first antenna substrate 411, the second antenna substrate 413 and the third antenna substrate 415). Each of the additional columns 492, 493, and 494 have an antenna substrate 410 in each of the first row 481, the second row 481 and the third row 483 to form a three row by four column grouping of antenna substrates 410.

The plurality of spacers 420 may be disposed below the plurality of antenna substrates 410 to maintain a constant distance between each antenna substrate or the metallization structure 430, if the antenna substrates are in a first row 481. In some aspects, the plurality of spacers 420 may each be configured to maintain the same constant distance. In other aspects, at least one of the plurality of spacers 420 may be configured to maintain a different constant distance than at least one other of the plurality of spacers 420. For example, a first spacer 421 may be disposed between the first antenna substrate 411 located in the first row 481 and the metallization structure 430. A second spacer 423 may be disposed between the second antenna substrate 413 located in the second row 482 and the first antenna substrate 411 located in the first row 481. A third spacer 425 may be disposed between the third antenna substrate 415 located in the third row 483 and the second antenna substrate 413 located in the second row 482. Each spacer 420 (e.g., 421, 423 and 425) is configured to maintain a constant distance between the associated substrate (e.g., 411, 413 and 415) and a lower row antenna substrate (e.g., 411 and 413) or the metallization structure 430, if the antenna substrate (e.g., 411) is locating in the first row 481. One or more spacers 420, in some aspects, may be formed of a non-conductive material. Further, one or more spacers 420 may be formed of a conductive material and may be used to electrically couple an associated antenna substrate to ground. Each spacer 420 has a plurality of conductive elements 422 is disposed within the each spacer 420. The conductive elements 422 may be conductive pillars, bars, etc. The conductive elements 422 may also include one or more pass-through conductive elements configured to electrically couple signals passing through lower row antenna substrates (e.g., 411) from higher row substrates (e.g., 413 and 415) to the metallization structure 430. Further, each of the plurality of conductive elements 422 may include at least one set of pass-through conductive elements for each antenna (not illustrated) in any subsequent antenna substrates whose signals pass through that substrate, as discussed in the foregoing.

The antenna module 400 of FIG. 4A, may further include at least one electrical component coupled to the metallization structure 430. For example, the at least one electrical component, as illustrated, may include one or more passive components 442 and 448, a radio frequency integrated circuit (RFIC) die 444; a power amplifier (PA) die 446; and a power supply component 450 (e.g., a power management integrated circuit (PMIC) and the like); each electrically coupled to the metallization structure 430 on a side opposite the plurality of antenna substrates 410. Each of these electrical components (e.g., passive components 442 and 448, RFIC die 444, PA die 446, power supply component 450) is encapsulated in a mold compound 460. Further, an electromagnetic interference (EMI) shield 465 is provided that at least partially encloses the mold compound 460 and components encapsulated in the mold compound 460 (e.g., passive components 442 and 448, RFIC die 444, PA die 446, power supply component 450) and metallization structure 430. In other aspects, the mold compound 460 and/or the EMI shield 465 may be omitted. In some aspects, the EMI shield 465 may be electrically coupled to at least one of the spacers 421, 423 and/or 425 (e.g., when formed of a conductive material) and may also be coupled to ground. Connection pads 470 can also be provided that are electrically coupled to the metallization structure 430 on the same side as the antenna substrates 411, 413 and 415.

Figure 4B:
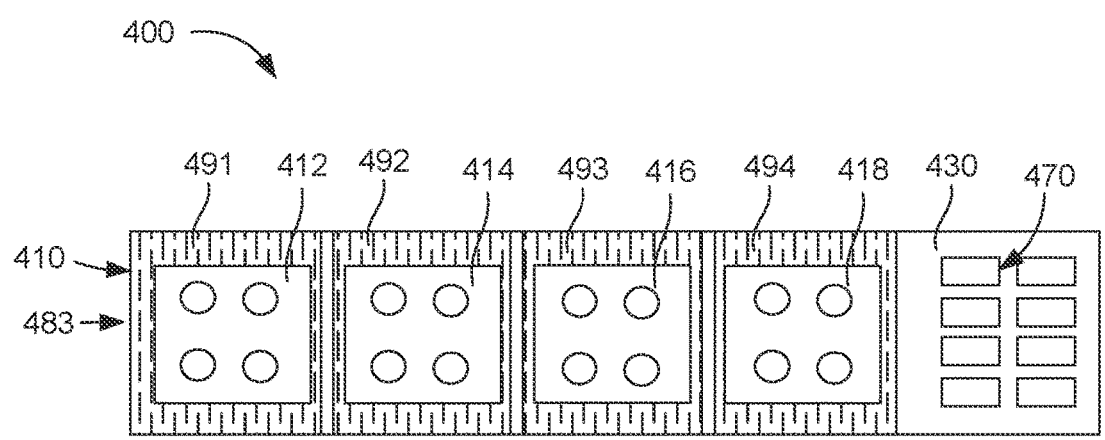
FIG. 4B illustrates a top view of the antenna module in FIG. 4A in accordance with at least one aspect of the disclosure.

FIG. 4B illustrates a top view of an antenna module 400 in accordance with at least one aspect of the disclosure. As discussed above, the antenna module 400 includes multiple antenna substrates 410 including the third row 483 of antenna substrates 410, which is the top row of antenna substrates 410 and visible in the top view. The metallization structure 430 is illustrated (the top layer being visible). The antenna substrates 410 may include one or more antennas. For example, the third row 483 antenna substrates 410 in columns 491, 492, 493, and 494 may each include one antenna, antenna 412, antenna 414, antenna 416 and antenna 418, respectively. Antennas 412, 414, 416 and 418, may be formed as patch antennas, or any suitable antenna type. The antennas 412, 414, 416 and 418 may be formed from any high conductive material, such as, copper (Cu), aluminum (Al), silver (Ag), gold (Au) or other conductive materials, alloys, or combinations thereof. Further, as illustrated in the top view, the connection pads 470 may be formed as a plurality of pads or any suitable configuration for coupling to external devices, components, circuits, etc. It will be appreciated that the foregoing illustration was provided solely to aid in explanation of the various aspects disclosed and should not be construed as limiting the various aspects disclosed. For example, although not expressly illustrated there may be more or less than one antenna in each antenna substrate. The antenna substrates and/or the antennas may be configured in a staggered or other non-linear configuration and each column (e.g., 491, 492, 493 and 494) may not have antenna substrates in all rows.

In order to fully illustrate various aspects of the present disclosure, methods of fabrication are presented. Other methods of fabrication are possible, and discussed fabrication methods are presented only to aid understanding of the concepts disclosed herein and are not intended to limit the various aspects disclosed or claimed.

Figure 5A:
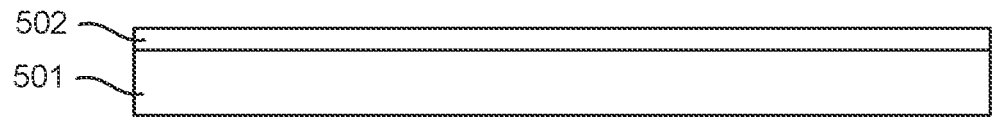
FIGS. 5A-5H illustrate different stages of an example process of fabricating an antenna module in accordance with at least one aspect of the disclosure.

FIG. 5A illustrates a portion of a fabrication process of an antenna module in accordance with some examples of the disclosure. As shown in FIG. 5A, the process can begin with an adhesive layer 502, which may be a tape, coating, and the like, being applied to a carrier 501 to facilitate the fabrication.

Figure 5B:
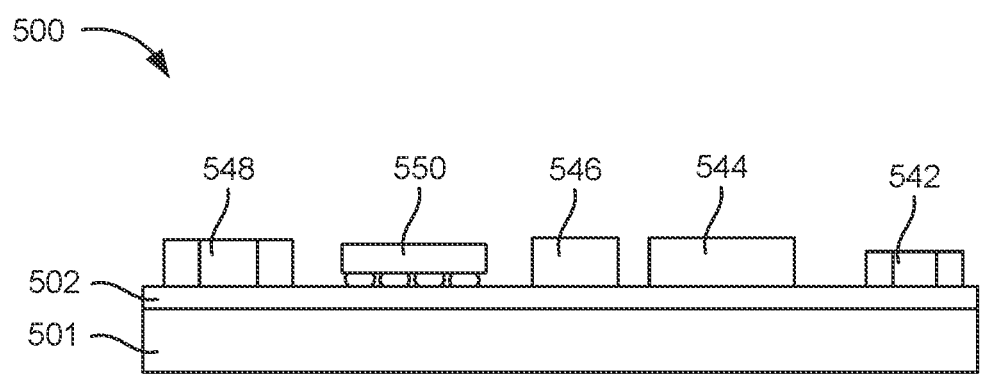

FIG. 5B illustrates a further portion of a fabrication process of an antenna module 500 in accordance with some examples of the disclosure. The process can continue with at least one electrical component being attached to the adhesive layer 502. For example, the at least one electrical component, as illustrated, may include one or more passive components 542 and 548, a radio frequency integrated circuit (RFIC) die 544; a power amplifier (PA) die 546; and a power supply component 550 (e.g., a power management integrated circuit (PMIC) and the like). The passive components 542 and 548, RFIC die 544, PA die 546, power supply component 550 can be placed in specific locations for future processing. It will be appreciated that the functionalities of each of the electrical components illustrated (e.g., passive components 542 and 548, RFIC die 544, PA die 546, power supply component 550) may be integrated into one or more combined components or may be further divide among multiple components. Accordingly, it will be appreciated that the foregoing illustrated aspects are provided merely as an example and should not be used to limit the various aspects disclosed to the illustrated components or arrangements.

Figure 5C:
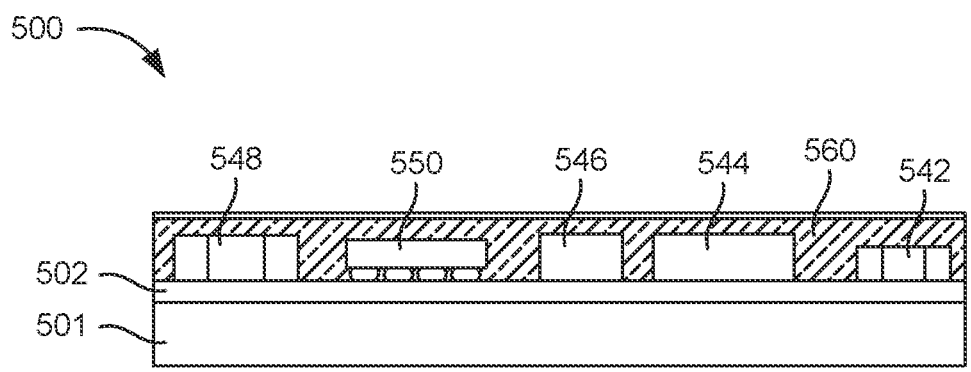

FIG. 5C illustrates a further portion of a fabrication process of an antenna module 500 in accordance with some examples of the disclosure. The process can continue with carrier 501 having the adhesive layer 502 with the attached at least one electrical component (e.g., passive components 542 and 548, RFIC die 544, PA die 546 and power supply component 550). In this portion of the fabrication process, the passive components 542 and 548, RFIC die 544, PA die 546 and power supply component 550 are encapsulated in a mold compound 560 to provide support and insulation of the electrical components.

Figure 5D:
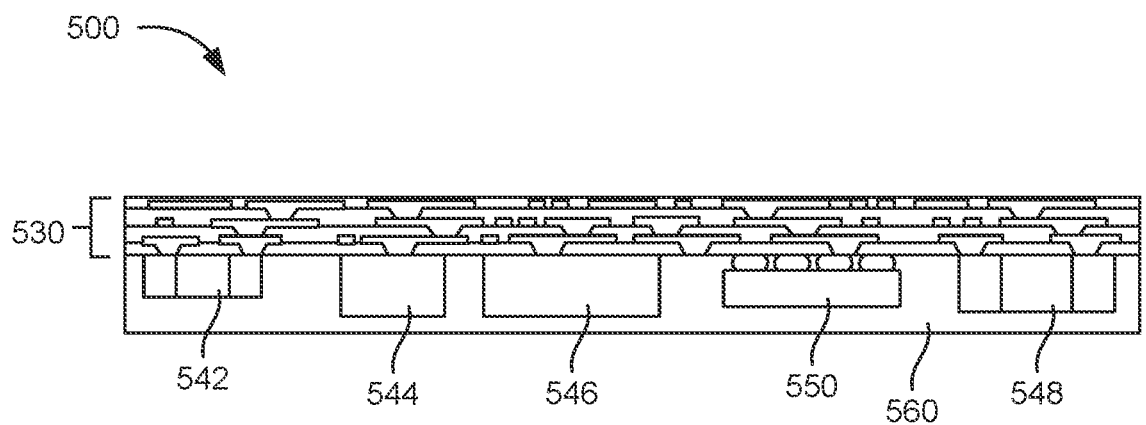

FIG. 5D illustrates a further portion of a fabrication process of an antenna module 500 in accordance with some examples of the disclosure. The process can continue with removing the carrier having the adhesive layer. A metallization structure 530 is built up as a series of insulating layers and metal layers, with vias connecting various metal layer to form conductive paths for coupling to the passive components 542 and 548, RFIC die 544, PA die 546 and power supply component 550. The insulating layers of metallization structure 530 may be inter-layer dielectric (ILD) layers. The insulating layers may be formed of a polyimide (PI), benzocyclobuten (BCB), polybenzoxazole (PBO), an acrylic, an epoxy, and/or any other suitable materials. These materials are provided as illustrative non-limiting examples. In some implementations, different insulating layers may be formed from different materials. The metal layers and vias may be formed of from any high conductive material, such as, copper (Cu), aluminum (Al), silver (Ag), gold (Au) or other conductive materials, alloys, or combinations thereof.

Figure 5E:
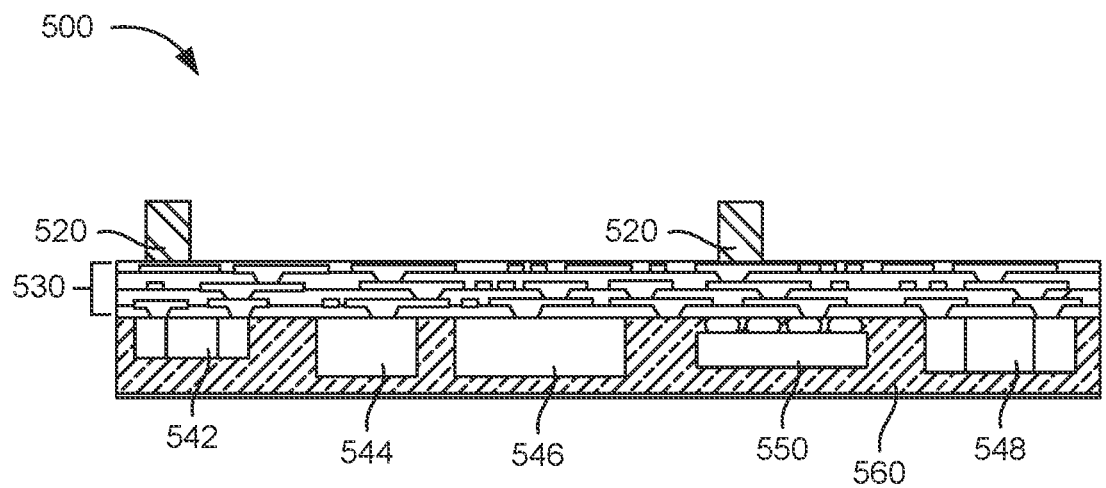

FIG. 5E illustrates a further portion of a fabrication process of an antenna module 500 in accordance with some examples of the disclosure. The process can continue with the metallization structure 530 formed and coupled to the passive components 542 and 548, RFIC die 544, PA die 546 and power supply component 550, which are encapsulated in mold compound 560. In this portion of the fabrication process, the spacer 520 is formed on the metallization structure 530. In some aspects, the spacer 520 may be formed by printing a continuous side wall of a constant height forming a loop, such that an open space is defined within. The spacer 520 may be formed by printing, lamination, or a lithography process. These processes allow for the spacer 520 to be formed to a precise height, which allows for forming a precise air gap under the antenna substrate.

Figure 5F:
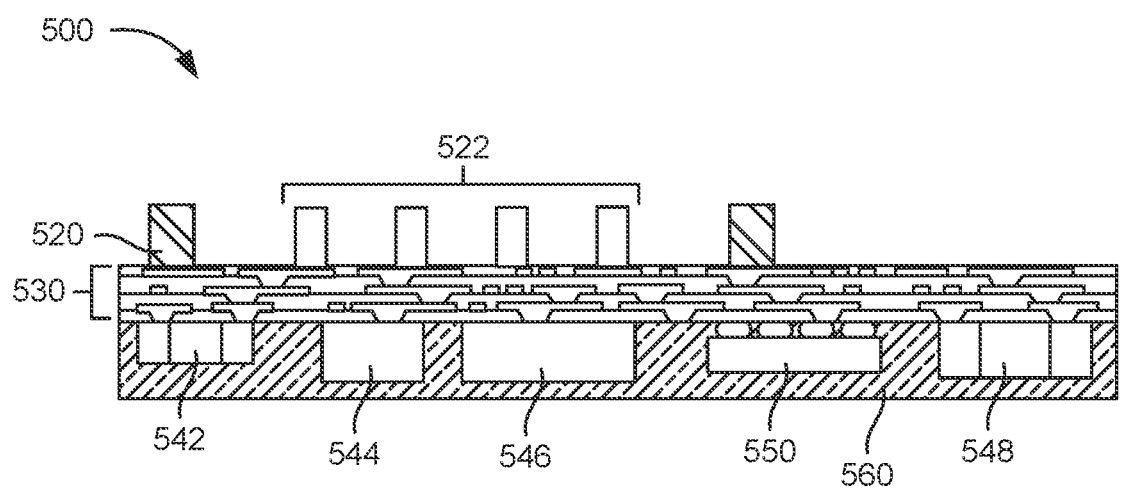

FIG. 5F illustrates a further portion of a fabrication process of an antenna module 500 in accordance with some examples of the disclosure. The process can continue with the spacer 520 formed on the metallization structure 530. The metallization structure 530 is electrically coupled to the passive components 542 and 548, RFIC die 544, PA die 546 and power supply component 550, which are encapsulated in mold compound 560. In this portion of the fabrication process, a plurality of conductive elements 522 is formed. The plurality of conductive elements 522 is disposed within the spacer 520. The conductive elements 522 may be formed as pillars, bars, and the like by a sputtering, photolithographic, or any suitable process. In some aspects, a premade pillar can be used or formed by Cu pillar plating. In some aspects the photolithographic process can include patterning a seed layer deposited by sputtering, plating or paste filling. The conductive elements will be placed in specific locations to be in a position to electrically couple the antenna substrate (not illustrated) to the metallization structure 530. The conductive elements 522 may be formed from any high conductive material, such as, copper (Cu), aluminum (Al), silver (Ag), gold (Au) or other conductive materials, alloys, or combinations thereof.

Figure 5G:
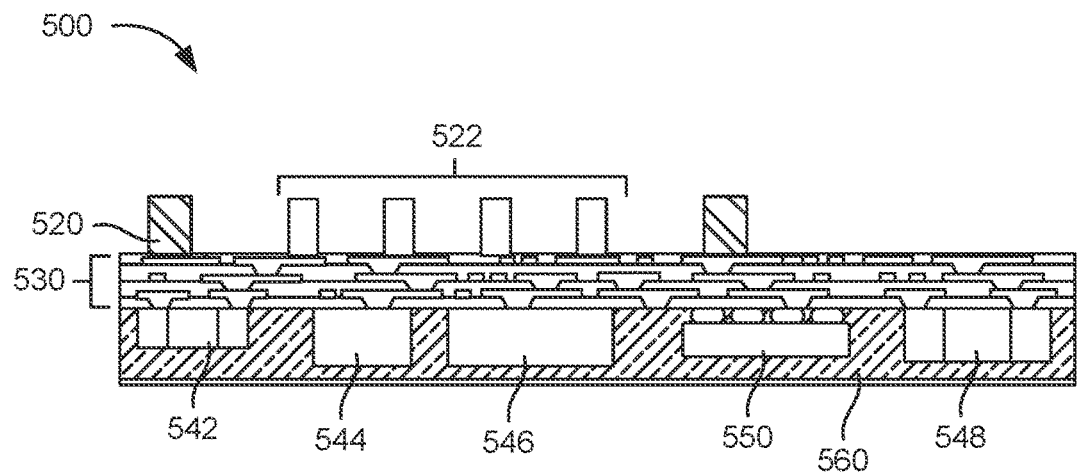

FIG. 5G illustrates a further portion of a fabrication process of an antenna module 500 in accordance with some examples of the disclosure. The process can continue with the plurality of conductive elements 522 formed within the spacer 520. The spacer 520 may be formed on the metallization structure 530. The metallization structure 530 is electrically coupled to the passive components 542 and 548, RFIC die 544, PA die 546 and power supply component 550, which are encapsulated in mold compound 560. In this portion of the fabrication process, the plurality of conductive elements 522 and the spacer 520 are planarized and reduced to a designated height. For example, using a back-grinding process, the height of the plurality of conductive elements 522 and the spacer 520 can be precisely set, which in turn sets the air gap. Likewise, the back-grinding process can be used to ensure a planar surface on the top, exposed portions of the plurality of conductive elements 522 and the spacer 520 to facilitate coupling to the antenna substrate (not illustrated).

Figure 5H:
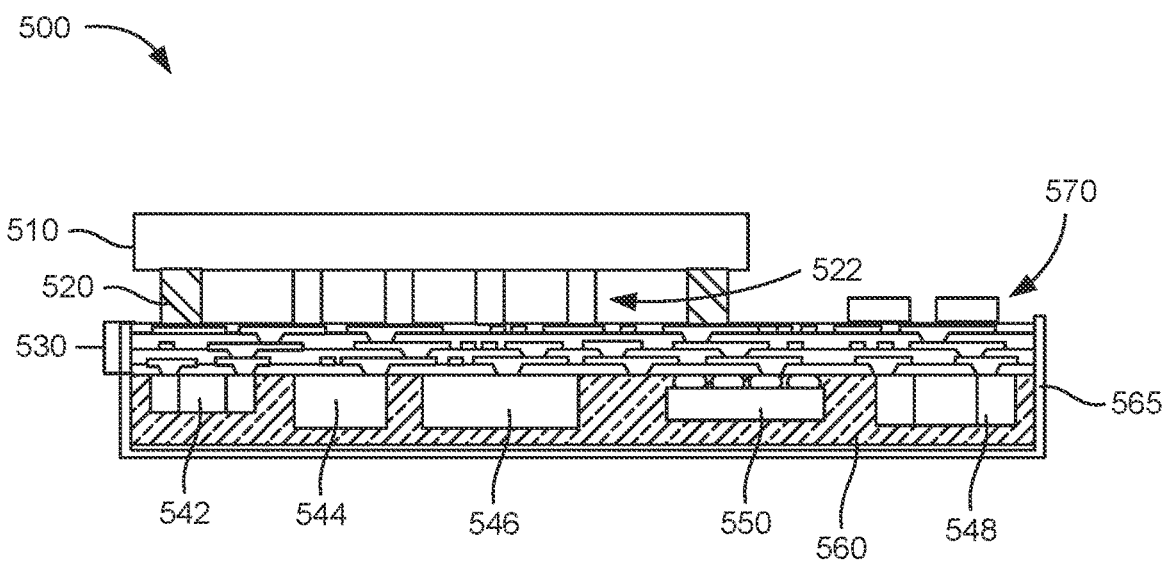

FIG. 5H illustrates a further portion of a fabrication process of an antenna module 500 in accordance with some examples of the disclosure. The process can continue with the plurality of conductive elements 522 formed within the spacer 520. Both the spacer 520 and the plurality of conductive elements 522 are ground to a designated height. The spacer 520 may be formed on the metallization structure 530. The metallization structure 530 is electrically coupled to the passive components 542 and 548, RFIC die 544, PA die 546 and power supply component 550, which are encapsulated in mold compound 560. In this portion of the fabrication process, an antenna substrate 510 can be coupled to the plurality of conductive elements 522 and the spacer 520. Additionally, an EMI shield can be formed over the mold 560 and at least a portion of the metallization structure 530. Finally, contact pads can be formed on the metallization structure 530 to allow for coupling to external circuits, components, devices, and the like In accordance with the various aspects disclosed herein, at least one aspect includes a device (e.g., antenna module (e.g., 100, 200, 300, 400 and 500) alone or integrated into another device) including: a first antenna substrate (e.g., 110, 210, 310, 311, 410, 411, 510, etc.) including one or more antennas (e.g., 112, 114, 116, 118, 212, 214, 216, 218, etc.). The device also includes a metallization structure (e.g., 130, 230, 330, 430 and 530). The device also includes a first spacer (e.g., 120, 220, 221, 320, 321, 420, 421, 520, etc.) disposed between the first antenna substrate and the metallization structure and configured to maintain a constant distance between the first antenna substrate and the metallization structure. The device also includes a first plurality of conductive elements (e.g., 122, 222, 322, 422, 522, etc.), disposed within the first spacer and configured to electrically couple the first antenna substrate to the metallization structure. The first spacer is configured to enclose all the conductive elements, electrically coupled to the first antenna substrate and is configured to form an air gap between the first antenna substrate and the metallization structure, where the first plurality of conductive elements are separated by air in the air gap.

It will be appreciated from the disclosure herein that the various technical advantages are provided by the various aspects disclosed. In at least some aspects, the spacer completely enclosing the plurality of electrical contacts provides for setting a precise height and forming an air gap under the antenna substrate, which provides for a Dk of 1.0, and improves loss, efficiency, and frequency bandwidth. Further, the spacer being formed directly on the metallization structure provides for faster manufacturing and assembly time, eliminates the complexity of partial molding, and reduces overall material and manufacturing cost, including eliminating extra substrate layers in the antenna portion which conventionally is used to satisfy symmetric stack-up. The metallization structure (e.g., RDL layers) provides for a thinner structure of the antenna module and improved design rules.

In further aspects by locating the passive and active components (e.g., RFIC, PA, and the like) on the opposite side of the metallization structure from the antenna module, the overall thickness can be reduced. Further, the antenna module is fully functional device as it includes the RFIC, PA, power supply, and passive components, in contrast with conventional solutions, which may just include an antenna module and some passive components. The optional EMI shield allows for an improved shielding in the antenna module (e.g., the active and passive components are shielded and portions of the metallization structure are also shielded) compared to a partial shielded structure of conventional designs. In further aspects, the antenna modules including multiple antenna substrates allow for each antenna substrate and/or antenna to be configured for a different frequency. Additionally, by locating the connection pads at the top of the metallization structure (opposite the active components) a more compact connection interface is provided, which is an improvement over conventional ball grid array (BGA) balls connecting to a printed circuit board (PCB).

Other technical advantages will be recognized from various aspects disclosed herein and these technical advantages are merely provided as examples and should not be construed to limit any of the various aspects disclosed herein.

Figure 6:
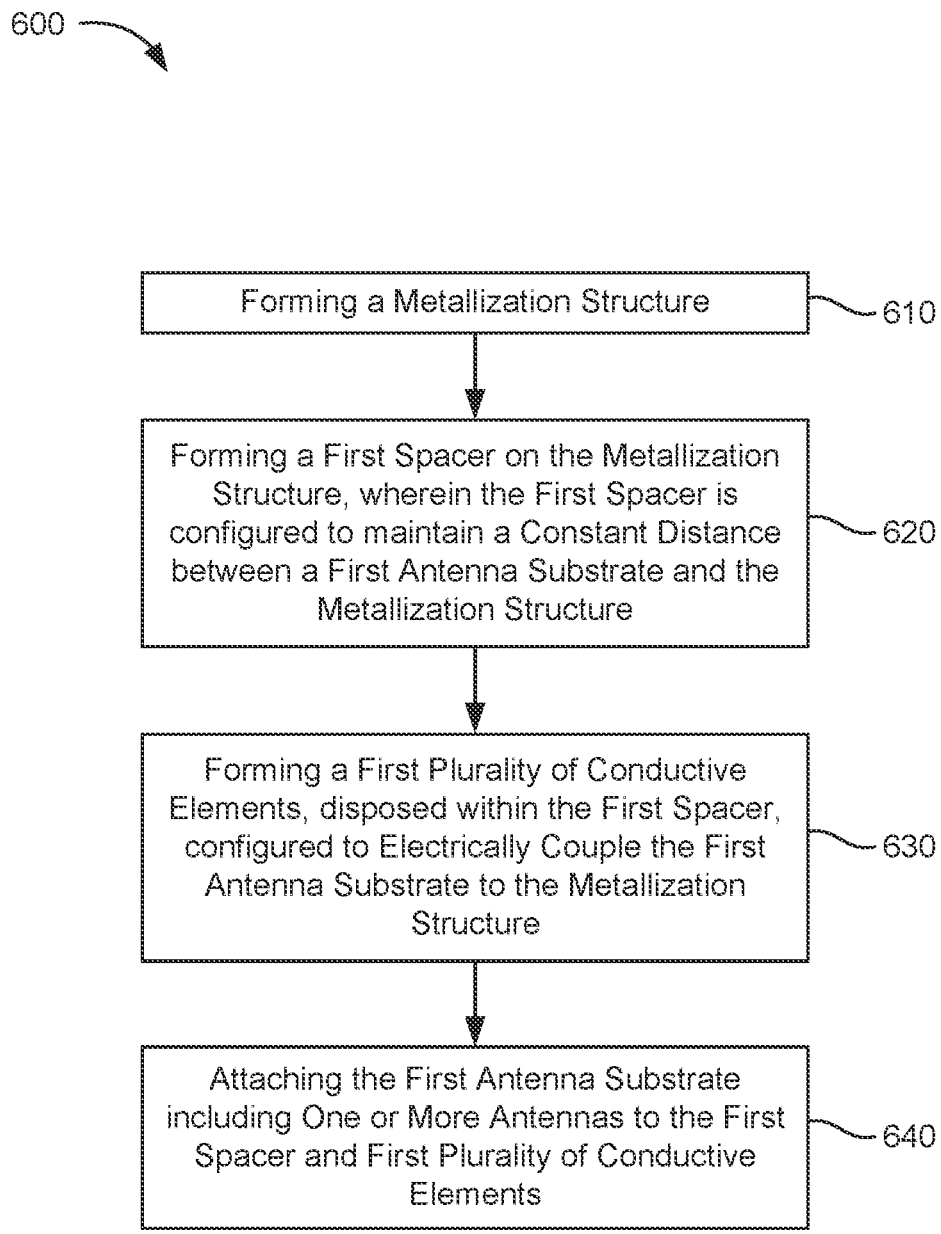
FIG. 6 illustrates a flowchart of a method for manufacturing an antenna module in accordance with at least one aspect of the disclosure.

It will be appreciated from the foregoing that there are various methods for fabricating devices including the antenna modules disclosed herein. FIG. 6 illustrates a flowchart of a method 600 for fabricating an antenna module in accordance with at least one aspect disclosed. In block 610, the fabrication process can include forming a metallization structure. In block 620, the fabrication process can further include forming a first spacer on the metallization structure, where the first spacer is configured to maintain a constant distance between a first antenna substrate and the metallization structure. In block 630, the fabrication process can further include forming a first plurality of conductive elements, disposed within the first spacer, and configured to electrically couple the first antenna substrate to the metallization structure. In block 640, the fabrication process can further include attaching the first antenna substrate including one or more antennas to the first spacer and first plurality of conductive elements, wherein the first spacer is configured to enclose all the conductive elements, electrically coupled to the first antenna substrate, and is configured to form an air gap between the first antenna substrate and the metallization structure, and wherein the first plurality of conductive elements are separated by air in the air gap. It will be appreciated from the foregoing disclosure that additional processes for fabricating the various aspects disclosed herein will be apparent to those skilled in the art and a literal rendition of the processes discussed above will not be provided or illustrated in the included drawings.

Figure 7:
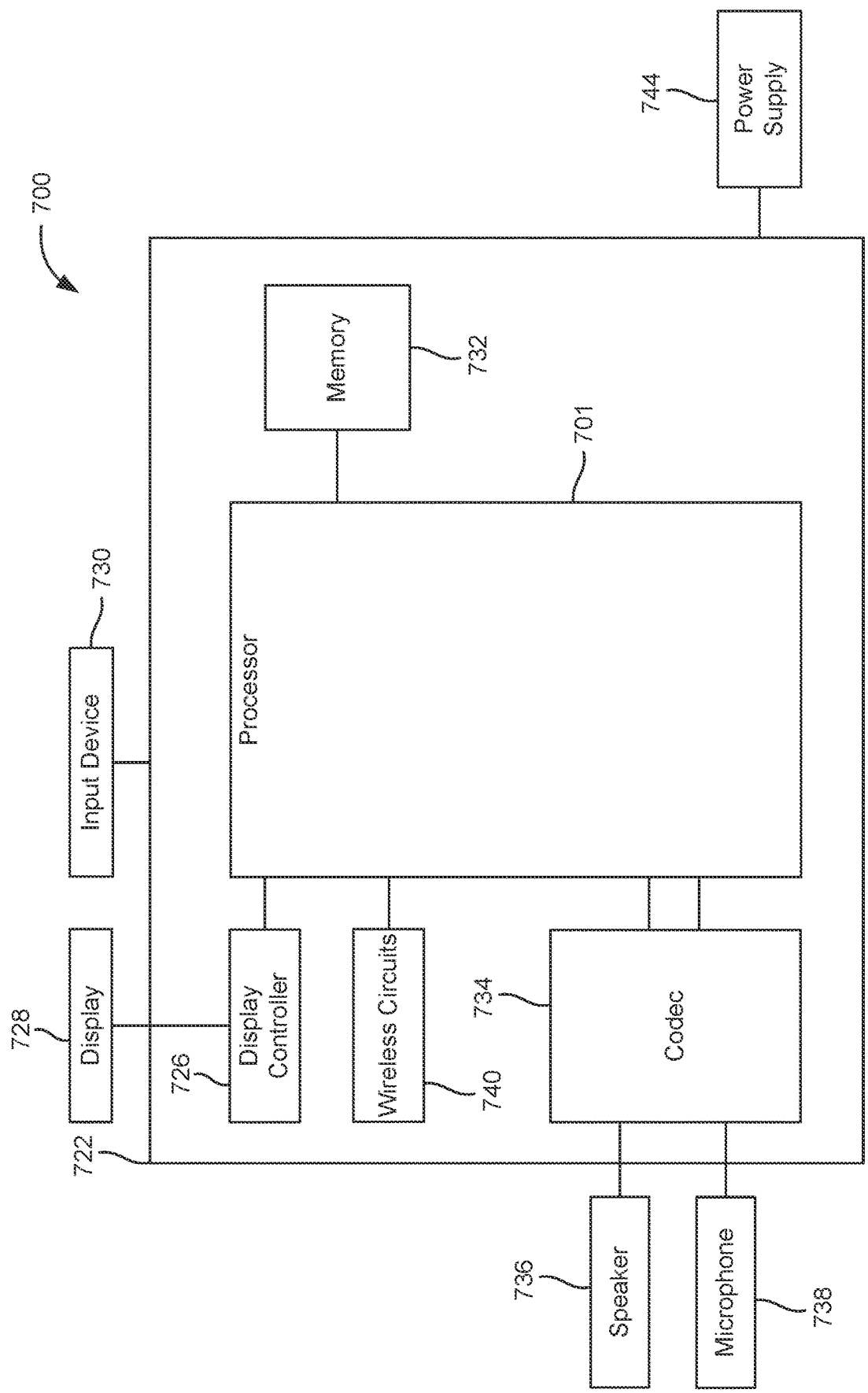
FIG. 7 illustrates a mobile device in accordance with at least one aspect of the disclosure.

FIG. 7 illustrates a mobile device in accordance with some examples of the disclosure.

Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 701. Processor 701 may be communicatively coupled to memory 732 over a link, which may be a die-to-die or chip-to-chip link. Mobile device 700 also includes display 728 and display controller 726, with display controller 726 coupled to processor 701 and to display 728.

In the illustrated aspects, FIG. 7 includes coder/decoder (CODEC) 734 (e.g., an audio and/or voice CODEC) coupled to processor 701; speaker 736 and microphone 738 coupled to CODEC 734; and wireless circuits 740 (which may include a modem, RF circuitry, filters, and one or more antenna modules, as disclosed herein) coupled to processor 701.

In a particular aspect, where one or more of the above-mentioned blocks are present, processor 701, display controller 726, memory 732, CODEC 734, and wireless circuits 740 can be included in a system-in-package or system-on-chip device 722. Input device 730 (e.g., physical or virtual keyboard), power supply 744 (e.g., battery), display 728, input device 730, speaker 736, microphone 738, wireless antenna 742, and power supply 744 may be external to system-on-chip device 722 and may be coupled to a component of system-on-chip device 722, such as an interface or a controller.

It should be noted that although FIG. 7 depicts a mobile device, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, an Internet of things (IoT) device, a wireless device in a vehicle, or other similar devices.

Figure 8:
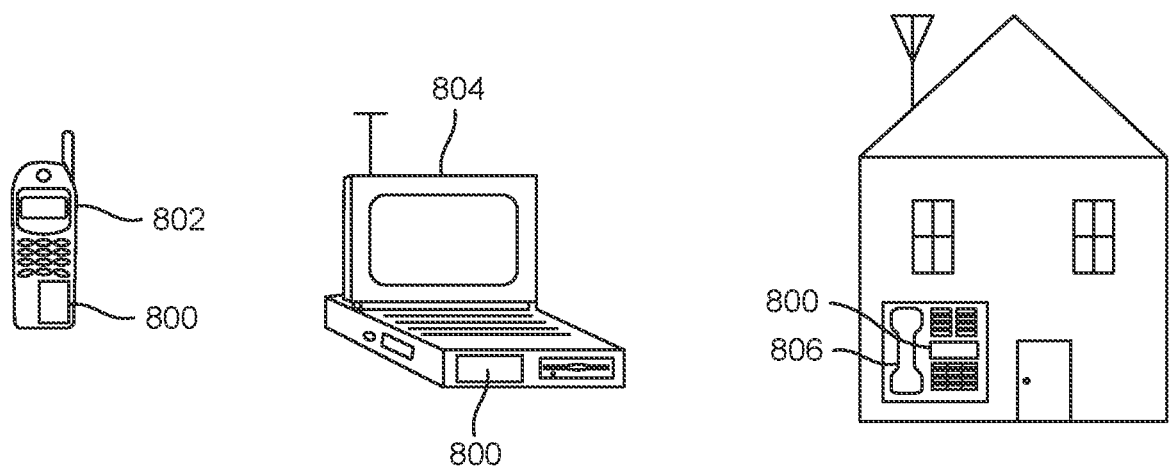
FIG. 8 illustrates various electronic devices that may be integrated with any of the aforementioned antenna modules in accordance with at least one aspect of the disclosure.

FIG. 8 illustrates various devices that may be integrated with any of the aforementioned antenna modules, in accordance with various examples of the disclosure. For example, a mobile phone device 802, a laptop computer device 804, and a fixed location terminal device 806 may each be consider generally user equipment (UE) and may include an antenna 800 as described herein. The antenna module 800 may be, for example, may be included in any of the devices described herein. The devices 802, 804, 806 illustrated in FIG. 8 are merely provided as examples. Other devices may also feature the antenna module 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that has wireless communication capabilities or any combination thereof.

The foregoing disclosed devices and functionalities may be designed and configured into computer files (e.g., RTL, GDSII, GERBER, and the like) stored on computer-readable media. Some or all such files may be provided to fabrication handlers who fabricate devices based on such files. Resulting products may include semiconductor wafers that are then cut into semiconductor die and packaged into antenna modules. The antenna modules may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-8 may be rearranged and/or combined into a single component, process, feature, or function or incorporated in several components, processes, or functions. Additional elements, components, processes, and/or functions may also be added without departing from the disclosure. It should also be noted that FIGS. 1-8 and corresponding description in the present disclosure are not limited to dies and/or ICs. In some implementations, FIGS. 1-8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, and the like). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in each claim. Rather, the various aspects of the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that although a dependent claim can refer in the claims to a specific combination with one of the other claims. However, other examples can also encompass or include a combination of said dependent claim with the subject matter of any other dependent claim or a combination of any feature with other dependent and independent claims. Such combinations are proposed herein, unless it is explicitly expressed or can be readily inferred that a specific combination is not intended (e.g., contradictory aspects, such as defining a feature as both an insulator and a conductor). Furthermore, it is also intended that features of a claim can be included in any other independent claim, even if said claim is not directly dependent on the independent claim.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses claims should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

In clause 1, a device includes: a first antenna substrate including one or more antennas; a metallization structure; a first spacer disposed between the first antenna substrate and the metallization structure, configured to maintain a constant distance between the first antenna substrate and the metallization structure; and a first plurality of conductive elements, disposed within the first spacer, configured to electrically couple the first antenna substrate to the metallization structure, wherein the first spacer is configured to enclose all the conductive elements, electrically coupled to the first antenna substrate, and is configured to form an air gap between the first antenna substrate and the metallization structure, and wherein the first plurality of conductive elements is separated by air in the air gap.

In further clause 2, which may be combined with clause 1, a plurality of connection pads, wherein the plurality of connection pads are electrically coupled to the metallization structure and located on a first side of the metallization structure, which is on a same side as the first antenna substrate.

In further clause 3, which may be combined with clause 2, at least one electrical component electrically coupled to the metallization structure on a second side, which is opposite the first antenna substrate.

In further clause 4, which may be combined with clause 3, the at least one electrical component comprises a radio frequency integrated circuit (RFIC); a power amplifier and a power supply component electrically coupled to the metallization structure; and one or more passive components, each electrically coupled to the metallization structure on a side opposite the first antenna substrate.

In further clause 5, which may be combined with any of clauses 3 to 4, the at least one electrical component is encapsulated in a mold compound.

In further clause 6, which may be combined with clause 5, an electromagnetic interference (EMI) shield configured to at least partially enclose the mold compound and the metallization structure.

In further clause 7, which may be combined with clause 6, the EMI shield is electrically coupled to the first spacer and to a ground.

In further clause 8, which may be combined with any of clauses 1 to 7, the first spacer is formed from a conductive material.

In further clause 9, which may be combined with clause 8, the first spacer is coupled to a ground.

In further clause 10, which may be combined with any of clauses 1 to 9, there is at least one conductive element per antenna.

In further clause 11, which may be combined with clause 10, there is at least 4 conductive elements per antenna.

In further clause 12, which may be combined with any of clauses 1 to 11, the first plurality of conductive elements are pillars or bars.

In further clause 13, which may be combined with any of clauses 1 to 12, the first plurality of conductive elements is copper (Cu), aluminum (Al), silver (Ag), gold (Au) or combinations thereof.

In further clause 14, which may be combined with any of clauses 1 to 13, a plurality of additional antenna substrates including one or more antennas; a plurality of additional spacers, wherein each additional spacer is disposed between and configured to maintain an associated constant distance between one of the plurality of additional antenna substrates and the metallization structure; and a plurality of additional conductive elements, wherein at least one conductive element of the plurality of additional conductive elements is disposed within each additional spacer and is configured to electrically couple each of the additional antenna substrates to the metallization structure.

In further clause 15, which may be combined with clause 14, at least one spacer is formed from a conductive material.

In further clause 16, which may be combined with clause 15, the at least one spacer is coupled to a ground.

In further clause 17, which may be combined with any of clauses 14 to 16, each spacer is configured to maintain a same constant distance.

In further clause 18, which may be combined with any of clauses 14 to 17, at least one spacer is configured to maintain a different constant distance than at least one other spacer.

In further clause 19, which may be combined with any of clauses 14 to 18, there is at least one conductive element per antenna.

In further clause 20, which may be combined with any of clauses 14 to 19, there is at least 4 conductive elements per antenna.

In further clause 21, which may be combined with any of clauses 14 to 20, the plurality of additional antenna substrates includes three additional antenna substrates arranged linearly and each antenna substrate is adjacent at least one other antenna substrate.

In further clause 22, which may be combined with any of clauses 14 to 21, the plurality of additional conductive elements are pillars or bars.

In further clause 23, which may be combined with any of clauses 1 to 22, a second antenna substrate including one or more antennas; a second spacer, wherein the second spacer is disposed between and configured to maintain a second constant distance between the second antenna substrate and the first antenna substrate; and a second plurality of conductive elements, disposed within the second spacer, configured to electrically couple the second antenna substrate to the first antenna substrate.

In further clause 24, which may be combined with clause 23, a third antenna substrate including one or more antennas; a third spacer, wherein the third spacer is disposed between and configured to maintain a third constant distance between the third antenna substrate and the second antenna substrate; and a third plurality of conductive elements, disposed within the third spacer, configured to electrically couple the third antenna substrate to the second antenna substrate.

In further clause 25, which may be combined with clause 24, the first plurality of conductive elements includes at least one set of conductive elements for each of the one or more antennas in the first antenna substrate.

In further clause 26, which may be combined with clause 25, the first plurality of conductive elements includes at least one set of pass-through conductive elements for each antenna in the second antenna substrate and the third antenna substrate.

In further clause 27, which may be combined with clause 26, each set of conductive elements include one or more conductive elements.

In further clause 28, which may be combined with any of clauses 26 to 27, the second plurality of conductive elements includes at least one set of conductive elements for each of the one or more antennas in the second antenna substrate.

In further clause 29, which may be combined with clause 28, the second plurality of conductive elements includes at least one set of pass-through conductive elements for each antenna in the third antenna substrate.

In further clause 30, which may be combined with clause 29, the third plurality of conductive elements includes at least one set of conductive elements for each of the one or more antennas in the third antenna substrate.

In further clause 31, which may be combined with any of clauses 24 to 30, the first antenna substrate, the second antenna substrate and the third antenna substrate are in a single column.

In further clause 32, which may be combined with clause 31, the first antenna substrate is in a first row, the second antenna substrate is in a second row and the third antenna substrate is in a third row, and wherein the first row is located between the second row and the metallization structure and the second row is located between the third row and the first row.

In further clause 33, which may be combined with clause 32, a plurality of additional antenna substrates, each including one or more antennas and each additional antenna substrate having an associated spacer and one or more associated conductive elements; each associated spacer is disposed below the associated antenna substrate; and each of the one or more associated conductive elements are disposed within each associated spacer and is configured to electrically couple each of the additional antenna substrates to another antenna substrate or the metallization structure.

In further clause 34, which may be combined with clause 33, the plurality of additional antenna substrates and associated spacers and one or more associated conductive elements are arranged in one or more additional columns or rows.

In further clause 35, which may be combined with clause 34, the plurality of additional antenna substrates and associated spacers and one or more associated conductive elements are arranged in three additional columns each having an antenna substrate in each of the first row, second row and third row to form a three row by four column grouping of antenna substrates.

In further clause 36, which may be combined with any of clauses 1 to 35, the metallization structure comprises: a plurality of metal layers; a plurality of insulating layers, wherein at least one insulating layer is disposed between adjacent metal layers; and a plurality of vias, wherein the plurality of vias are used to electrically couple at least some portions of different metal layers.

In further clause 37, which may be combined with clause 36, the plurality of insulating layers is at least one of a polyimide (Pp, benzocyclobuten (BCB), polybenzoxazole (PBO), an acrylic, or an epoxy material.

In further clause 38, which may be combined with any of clauses 36 to 37, the plurality of metal layers and vias may be formed of at least one of copper (Cu), aluminum (Al), silver (Ag), gold (Au) or combinations thereof.

In further clause 39, which may be combined with any of clauses 1 to 38, the device is an antenna module.

In further clause 40, which may be combined with any of clauses 1 to 39, the device is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

In clause 41, a method of fabricating a device includes: forming a metallization structure;

forming a first spacer on the metallization structure, wherein the first spacer is configured to maintain a constant distance between a first antenna substrate and the metallization structure; forming a first plurality of conductive elements, disposed within the first spacer, configured to electrically couple the first antenna substrate to the metallization structure; and attaching the first antenna substrate including one or more antennas to the first spacer and first plurality of conductive elements, wherein the first spacer encloses all the conductive elements, is electrically coupled to the first antenna substrate and forms an air gap between the first antenna substrate and the metallization structure, and wherein the first plurality of conductive elements are separated by air in the air gap.

In further clause 42, which may be combined with clause 41, the method includes forming a plurality of connection pads electrically coupled to the metallization structure and located on a first side of the metallization structure, which is on a same side as the first antenna substrate.

In further clause 43, which may be combined with clause 42, the method includes forming at least one electrical component electrically coupled to the metallization structure on a second side, which is opposite the first antenna substrate.

In further clause 44, which may be combined with clause 43, the at least one electrical component comprises a radio frequency integrated circuit (RFIC); a power amplifier and a power supply component electrically coupled to the metallization structure; and one or more passive components, each electrically coupled to the metallization structure on a side opposite the first antenna substrate.

In further clause 45, which may be combined with any of clauses 43 to 44, the method includes encapsulating the at least one electrical component in a mold compound.

In further clause 46, which may be combined with clause 45, the method includes forming an electromagnetic interference (EMI) shield configured to at least partially enclose the mold compound and the metallization structure.

In further clause 47, which may be combined with clause 46, the method includes electrically coupling the EMI shield to the first spacer and to a ground.

In further clause 48, which may be combined with any of clauses 41 to 47, the method includes grinding the first spacer and the first plurality of conductive elements prior to attaching the first antenna substrate.

In further clause 49, which may be combined with any of clauses 41 to 48, the method includes forming a plurality of additional spacers, wherein each additional spacer is disposed between and configured to maintain an associated constant distance between one of a plurality of additional antenna substrates and the metallization structure; and forming a plurality of additional conductive elements, wherein at least one conductive element of the plurality of additional conductive elements is disposed within each additional spacer and is configured to electrically couple each of the additional antenna substrates to the metallization structure; and attaching the plurality of additional antenna substrates, including one or more antennas, to the plurality of additional spacers and to the plurality of additional conductive elements.

In further clause 50, which may be combined with clause 49, the plurality of additional antenna substrates includes three additional antenna substrates arranged linearly and each antenna substrate is adjacent at least one other antenna substrate.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:
1. A device, comprising:
a first antenna substrate including one or more antennas;
a metallization structure;
a first spacer disposed between the first antenna substrate and the metallization structure, configured to maintain a constant distance between the first antenna substrate and the metallization structure; and
a first plurality of conductive elements, disposed within the first spacer, configured to electrically couple the first antenna substrate to the metallization structure, wherein the first spacer is configured to enclose all the conductive elements, electrically coupled to the first antenna substrate, and is configured to form an air gap between the first antenna substrate and the metallization structure, wherein the first plurality of conductive elements is separated by air in the air gap; and an electromagnetic interference (EMI) shield configured to at least partially enclose the metallization structure and a molded structure disposed on the metallization structure on a side opposite the first antenna substrate, wherein the molded structure comprises at least one electrical component electrically coupled to the metallization structure on a second side, which is opposite the first antenna substrate.

2. The device of claim 1, further comprising a plurality of connection pads, wherein the plurality of connection pads are electrically coupled to the metallization structure and located on a first side of the metallization structure, which is on a same side as the first antenna substrate.

3. The device of claim 1, wherein the at least one electrical component comprises a radio frequency integrated circuit (RFIC); a power amplifier and a power supply component electrically coupled to the metallization structure; and one or more passive components, each electrically coupled to the metallization structure on the second side.

4. The device of claim 1, wherein the at least one electrical component is encapsulated in a mold compound.

5. The device of claim 4, wherein
the electromagnetic interference (EMI) shield is configured to at least partially enclose the mold compound and the metallization structure.

6. The device of claim 5, wherein the EMI shield is electrically coupled to the first spacer and to a ground.

7. The device of claim 1, wherein the first spacer is formed from a conductive material.

8. The device of claim 7, wherein the first spacer is coupled to a ground.

9. The device of claim 1, wherein there is at least one conductive element per antenna.

10. The device of claim 9, wherein there is at least 4 conductive elements per antenna.

11. The device of claim 1, wherein the first plurality of conductive elements are pillars or bars.

12. The device of claim 1, wherein the first plurality of conductive elements are copper (Cu), aluminum (Al), silver (Ag), gold (Au) or combinations thereof.

13. The device of claim 1, wherein the metallization structure comprises:
a plurality of metal layers;
a plurality of insulating layers, wherein at least one insulating layer is disposed between adjacent metal layers; and
a plurality of vias, wherein the plurality of vias are used to electrically couple at least some portions of different metal layers.

14. The device of claim 13, wherein the plurality of insulating layers are at least one of a polyimide (PI), benzocyclobuten (BCB), polybenzoxazole (PBO), an acrylic, or an epoxy material.

15. The device of claim 13, wherein the plurality of metal layers and vias may be formed of at least one of copper (Cu), aluminum (Al), silver (Ag), gold (Au) or combinations thereof.

16. The device of claim 1, wherein the device is an antenna module.

17. The device of claim 1, wherein the device is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

18. A device, comprising:
a first antenna substrate including one or more antennas;
a metallization structure;
a first spacer disposed between the first antenna substrate and the metallization structure, configured to maintain a constant distance between the first antenna substrate and the metallization structure; and
a first plurality of conductive elements, disposed within the first spacer, configured to electrically couple the first antenna substrate to the metallization structure,
wherein the first spacer is configured to enclose all the conductive elements, electrically coupled to the first antenna substrate, and is configured to form an air gap between the first antenna substrate and the metallization structure, wherein the first plurality of conductive elements is separated by air in the air gap;
a plurality of additional antenna substrates including one or more antennas;
a plurality of additional spacers, wherein each additional spacer is disposed between and configured to maintain an associated constant distance between one of the plurality of additional antenna substrates and the metallization structure; and
a plurality of additional conductive elements, wherein at least one conductive element of the plurality of additional conductive elements is disposed within each additional spacer and is configured to electrically couple each of the additional antenna substrates to the metallization structure.

19. The device of claim 18, wherein at least one spacer is formed from a conductive material.

20. The device of claim 19, wherein the at least one spacer is coupled to a ground.

21. The device of claim 18, wherein each spacer is configured to maintain a same constant distance.

22. The device of claim 18, wherein at least one spacer is configured to maintain a different constant distance than at least one other spacer.

23. The device of claim 18, wherein there is at least one conductive element per antenna.

24. The device of claim 18, wherein there is at least 4 conductive elements per antenna.

25. The device of claim 18, wherein the plurality of additional antenna substrates include three additional antenna substrates arranged linearly and wherein each antenna substrate is adjacent at least one other antenna substrate.

26. The device of claim 18, wherein the plurality of additional conductive elements are pillars or bars.

27. A device, comprising:
a first antenna substrate including one or more antennas;
a metallization structure;
a first spacer disposed between the first antenna substrate and the metallization structure, configured to maintain a constant distance between the first antenna substrate and the metallization structure; and
a first plurality of conductive elements, disposed within the first spacer, configured to electrically couple the first antenna substrate to the metallization structure, wherein the first spacer is configured to enclose all the conductive elements, electrically coupled to the first antenna substrate, and is configured to form an air gap between the first antenna substrate and the metallization structure, wherein the first plurality of conductive elements is separated by air in the air gap;

a second antenna substrate including one or more antennas;

a second spacer, wherein the second spacer is disposed between and configured to maintain a second constant distance between the second antenna substrate and the first antenna substrate; and a second plurality of conductive elements, disposed within the second spacer, configured to electrically couple the second antenna substrate to the first antenna substrate, wherein the second spacer is configured to enclose all the second plurality of conductive elements, electrically coupled to the second antenna substrate, and is configured to form a second air gap between the second antenna substrate and the first antenna substrate.

28. The device of claim 27, further comprising:
a third antenna substrate including one or more antennas;
a third spacer, wherein the third spacer is disposed between and configured to maintain a third constant distance between the third antenna substrate and the second antenna substrate; and
a third plurality of conductive elements, disposed within the third spacer, configured to electrically couple the third antenna substrate to the second antenna substrate,
wherein the third spacer is configured to enclose all the third plurality of conductive elements, electrically coupled to the third antenna substrate, and is configured to form a third air gap between the third antenna substrate and the second antenna substrate.

29. The device of claim 28, wherein the first plurality of conductive elements includes at least one set of conductive elements for each of the one or more antennas in the first antenna substrate.

30. The device of claim 29, wherein the first plurality of conductive elements includes at least one set of pass-through conductive elements for each antenna in the second antenna substrate and the third antenna substrate.

31. The device of claim 30, wherein each set of conductive elements include one or more conductive elements.

32. The device of claim 30, wherein the second plurality of conductive elements includes at least one set of conductive elements for each of the one or more antennas in the second antenna substrate.

33. The device of claim 32, wherein the second plurality of conductive elements includes at least one set of pass-through conductive elements for each antenna in the third antenna substrate.

34. The device of claim 33, wherein the third plurality of conductive elements includes at least one set of conductive elements for each of the one or more antennas in the third antenna substrate.

35. The device of claim 28, wherein the first antenna substrate, the second antenna substrate and the third antenna substrate are in a single column.

36. The device of claim 35, wherein the first antenna substrate is in a first row, the second antenna substrate is in a second row and the third antenna substrate is in a third row, and
wherein the first row is located between the second row and the metallization structure and the second row is located between the third row and the first row.

37. The device of claim 36, further comprising:
a plurality of additional antenna substrates, each including one or more antennas and each additional antenna substrate having an associated spacer and one or more associated conductive elements;
wherein each associated spacer is disposed below the associated antenna substrate; and
wherein each of the one or more associated conductive elements are disposed within each associated spacer and is configured to electrically couple each of the additional antenna substrates to another antenna substrate or the metallization structure.

38. The device of claim 37, wherein the plurality of additional antenna substrates and associated spacers and one or more associated conductive elements are arranged in one or more additional columns or rows.

39. The device of claim 38, wherein the plurality of additional antenna substrates and associated spacers and one or more associated conductive elements are arranged in three additional columns each having an antenna substrate in each of the first row, second row and third row to form a three row by four column grouping of antenna substrates.

40. A method of fabricating a device, comprising:
forming a metallization structure;
forming a first spacer on the metallization structure, wherein the first spacer is configured to maintain a constant distance between a first antenna substrate and the metallization structure;
forming a first plurality of conductive elements, disposed within the first spacer, configured to electrically couple the first antenna substrate to the metallization structure; and
attaching the first antenna substrate including one or more antennas to the first spacer and first plurality of conductive elements,
wherein the first spacer encloses all the conductive elements, is electrically coupled to the first antenna substrate and forms an air gap between the first antenna substrate and the metallization structure,
wherein the first plurality of conductive elements is separated by air in the air gap; and
forming an electromagnetic interference (EMI) shield configured to at least partially enclose the metallization structure and a molded structure disposed on the metallization structure on a side opposite the first antenna substrate, wherein the molded structure comprises at least one electrical component electrically coupled to the metallization structure on a second side, which is opposite the first antenna substrate.

41. The method of claim 40, further comprising:
forming a plurality of connection pads electrically coupled to the metallization structure and located on a first side of the metallization structure, which is on a same side as the first antenna substrate.

42. The method of claim 41, further comprising
forming the at least one electrical component electrically coupled to the metallization structure.

43. The method of claim 42, wherein the at least one electrical component comprises a radio frequency integrated circuit (RFIC); a power amplifier and a power supply component electrically coupled to the metallization structure; and one or more passive components, each electrically coupled to the metallization structure on a side opposite the first antenna substrate.

44. The method of claim 42, further comprising:
encapsulating the at least one electrical component in a mold compound.

45. The method of claim 44, wherein
the electromagnetic interference (EMI) shield configured to at least partially enclose the mold compound and the metallization structure.

46. The method of claim 45, further comprising:
electrically coupling the EMI shield to the first spacer and to a ground.

47. The method of claim 40, further comprising:
grinding the first spacer and the first plurality of conductive elements prior to attaching the first antenna substrate.

48. The method of claim 40, further comprising:
forming a plurality of additional spacers, wherein each additional spacer is disposed between and configured to maintain an associated constant distance between one of a plurality of additional antenna substrates and the metallization structure; and
forming a plurality of additional conductive elements, wherein at least one conductive element of the plurality of additional conductive elements is disposed within each additional spacer and is configured to electrically couple each of the additional antenna substrates to the metallization structure; and
attaching the plurality of additional antenna substrates, including one or more antennas, to the plurality of additional spacers and to the plurality of additional conductive elements.

49. The method of claim 48, wherein the plurality of additional antenna substrates includes three additional antenna substrates arranged linearly and wherein each antenna substrate is adjacent at least one other antenna substrate.

\* \* \* \* \*